(12) United States Patent
Humpston et al.

(10) Patent No.: US 7,719,121 B2
(45) Date of Patent: May 18, 2010

(54) MICROELECTRONIC PACKAGES AND METHODS THEREFOR

(75) Inventors: Giles Humpston, Aylesbury (GB);
Guilian Gao, San Jose, CA (US);
Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 136 days.

(21) Appl. No.: 11/581,888

(22) Filed: Oct. 17, 2006

(65) Prior Publication Data

US 2008/0088033 A1    Apr. 17, 2008

(51) Int. Cl.
*H01L 23/48* (2006.01)

(52) U.S. Cl. .................. 257/784; 257/E23.169

(58) Field of Classification Search .................. 257/780, 257/E23.169–E23.178, 781, 784, 737, E23.021
See application file for complete search history.

(56) References Cited

U.S. PATENT DOCUMENTS

| | | | |
|---|---|---|---|
| 5,189,505 | A | 2/1993 | Bartelink |
| 5,397,997 | A | 3/1995 | Tuckerman et al. |
| 5,731,709 | A | 3/1998 | Pastore et al. |
| 5,811,982 | A | 9/1998 | Beaman et al. |
| 6,258,625 | B1 | 7/2001 | Brofman et al. |
| 6,458,411 | B1 | 10/2002 | Goossen et al. |
| 6,495,914 | B1 | 12/2002 | Sekine et al. |
| 6,550,666 | B2 | 4/2003 | Chew et al. |
| 6,578,754 | B1 | 6/2003 | Tung |
| 6,602,730 | B2 * | 8/2003 | Jiang et al. ............... 438/25 |
| 6,624,653 | B1 | 9/2003 | Cram |
| 7,019,410 | B1 * | 3/2006 | Jiang ........................ 257/783 |
| 7,227,263 | B2 * | 6/2007 | Yamaguchi ................. 257/738 |
| 7,397,121 | B2 * | 7/2008 | Chou et al. ................. 257/737 |
| 2005/0181655 | A1 | 8/2005 | Haba et al. |
| 2005/0285246 | A1 | 12/2005 | Haba et al. |

FOREIGN PATENT DOCUMENTS

| | | |
|---|---|---|
| JP | 62-68015 A | 9/1994 |
| WO | 9522172 | 8/1995 |
| WO | 2006101861 | 9/2006 |

OTHER PUBLICATIONS

International Search Report, PCT/US2007/022233.
http://www.timicorp.com/serv_pillar.htm.
North Corporation, "Processed Intra-layer Interconnection Material for PWBs [Etched Copper Bump with Copper Foil]," NMBI™, Version 2001.6.
Neo-Manhattan Technology, a Novel HDI Manufacturing Process, "High-Density Interconnects for Advanced Flex Substrates & 3-D Package Stacking,"IPC Flex & Chips Symposium, Tempe, AZ, Feb. 11-12, 2003.

* cited by examiner

*Primary Examiner*—Wael Fahmy
*Assistant Examiner*—Bilkis Jahan
(74) *Attorney, Agent, or Firm*—Lerner, David, Littenberg, Krumholz & Mentlik, LLP

(57) ABSTRACT

A microelectronic package includes a microelectronic element having contacts, a flexible substrate spaced from and overlying the microelectronic element and a plurality of conductive posts extending from the flexible substrate and projecting away from the microelectronic element. The conductive posts are electrically interconnected with the microelectronic element. Each conductive post has a conductive base that is in contact with the flexible substrate and a conductive tip that extends from the base, with the base of the conductive post having a larger diameter than the tip of the conductive post. In certain embodiments, the conductive base and the conductive tip have a cylindrical shape.

38 Claims, 18 Drawing Sheets

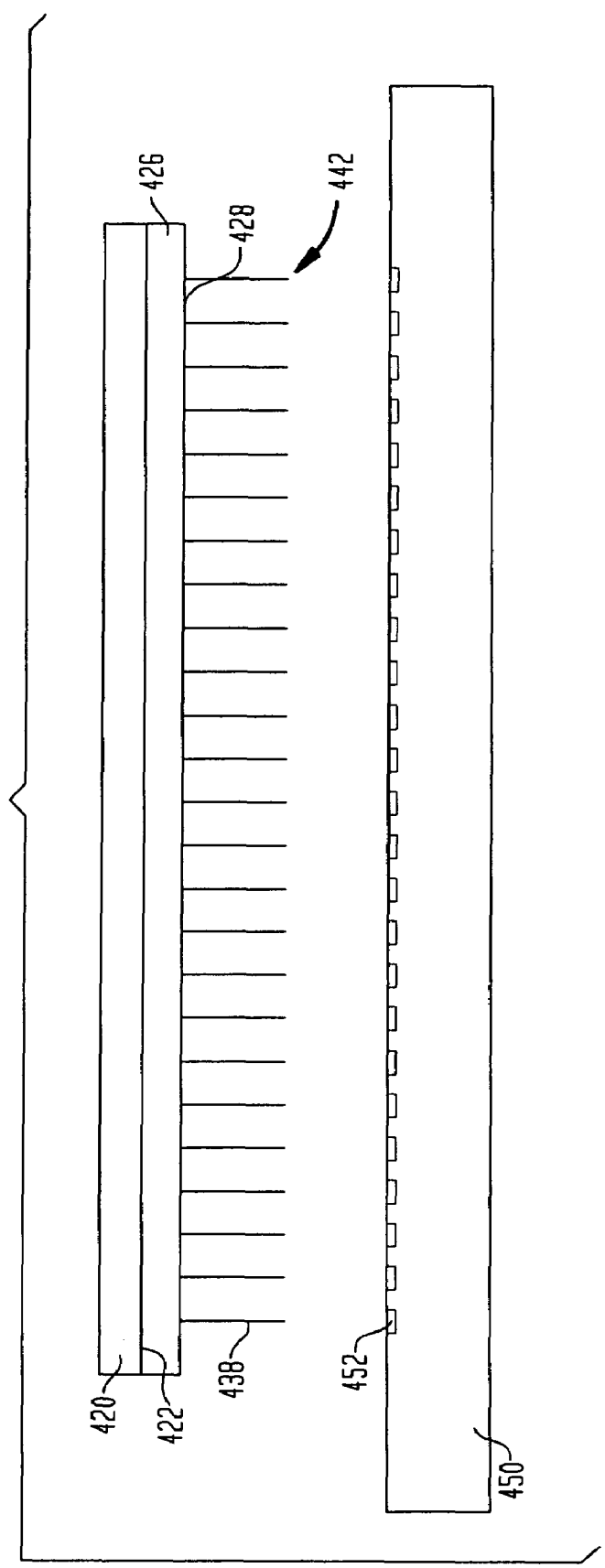

MICROELECTRONIC PACKAGES AND METHODS THEREFOR

FIELD OF THE INVENTION

The present invention relates to microelectronic packages and to methods of making and testing microelectronic packages.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds. Assemblies including packages can suffer from stresses imposed by differential thermal expansion and contraction of the device and the substrate. During operation, as well as during manufacture, a semiconductor chip tends to expand and contract by an amount different from the amount of expansion and contraction of a circuit board. Where the terminals of the package are fixed relative to the chip or other device, such as by using solder, these effects tend to cause the terminals to move relative to the contact pads on the circuit board. This can impose stresses in the solder that connects the terminals to the contact pads on the circuit board. As disclosed in certain preferred embodiments of U.S. Pat. Nos. 5,679,977; 5,148,266; 5,148,265; 5,455,390; and 5,518,964, the disclosures of which are incorporated by reference herein, semiconductor chip packages can have terminals that are movable with respect to the chip or other device incorporated in the package. Such movement can compensate to an appreciable degree for differential expansion and contraction.

Testing of packaged devices poses another formidable problem. In some manufacturing processes, it is necessary to make temporary connections between the terminals of the packaged device and a test fixture, and operate the device through these connections to assure that the device is fully functional. Ordinarily, these temporary connections must be made without bonding the terminals of the package to the test fixture. It is important to assure that all of the terminals are reliably connected to the conductive elements of the test fixture. However, it is difficult to make connections by pressing the package against a simple test fixture such as an ordinary circuit board having planar contact pads. If the terminals of the package are not coplanar, or if the conductive elements of the test fixture are not coplanar, some of the terminals will not contact their respective contact pads on the test fixture. For example, in a BGA package, differences in the diameter of the solder balls attached to the terminals, and non-planarity of the chip carrier, may cause some of the solder balls to lie at different heights.

These problems can be alleviated through the use of specially constructed test fixtures having features arranged to compensate for non-planarity. However, such features add to the cost of the test fixture and, in some cases, introduce some unreliability into the test fixture itself. This is particularly undesirable because the test fixture, and the engagement of the device with the test fixture, should be more reliable than the packaged devices themselves in order to provide a meaningful test. Moreover, devices used for high-frequency operation are typically tested by applying high frequency signals. This requirement imposes constraints on the electrical characteristics of the signal paths in the test fixture, which further complicates construction of the test fixture.

Additionally, when testing packaged devices having solder balls connected with terminals, solder tends to accumulate on those parts of the test fixture that engage the solder balls. This accumulation of solder residue can shorten the life of the test fixture and impair its reliability.

A variety of solutions have been put forth to deal with the aforementioned problems. Certain packages disclosed in the aforementioned patents have terminals that can move with respect to the microelectronic device. Such movement can compensate to some degree for non-planarity of the terminals during testing.

U.S. Pat. Nos. 5,196,726 and 5,214,308, both issued to Nishiguchi et al., disclose a BGA-type approach in which bump leads on the face of the chip are received in cup-like sockets on the substrate and bonded therein by a low-melting point material. U.S. Pat. No. 4,975,079 issued to Beaman et al. discloses a test socket for chips in which dome-shaped contacts on the test substrate are disposed within conical guides. The chip is forced against the substrate so that the solder balls enter the conical guides and engage the dome-shaped pins on the substrate. Sufficient force is applied so that the dome-shaped pins actually deform the solder balls of the chip.

A further example of a BGA socket may be found in commonly assigned U.S. Pat. No. 5,802,699, issued Sep. 8, 1998, the disclosure of which is hereby incorporated by reference herein. The '699 patent discloses a sheet-like connector having a plurality of holes. Each hole is provided with at least one resilient laminar contact extending inwardly over a hole. The bump leads of a BGA device are advanced into the holes so that the bump leads are engaged with the contacts. The assembly can be tested, and if found acceptable, the bump leads can be permanently bonded to the contacts.

Commonly assigned U.S. Pat. No. 6,202,297, issued Mar. 20, 2001, the disclosure of which is hereby incorporated by reference herein, discloses a connector for microelectronic devices having bump leads and methods for fabricating and using the connector. In one embodiment of the '297 patent, a dielectric substrate has a plurality of posts extending upwardly from a front surface. The posts may be arranged in an array of post groups, with each post group defining a gap therebetween. A generally laminar contact extends from the top of each post. In order to test a device, the bump leads of the device are each inserted within a respective gap thereby engaging the contacts which wipe against the bump lead as it continues to be inserted. Typically, distal portions of the contacts deflect downwardly toward the substrate and outwardly away from the center of the gap as the bump lead is inserted into a gap.

Commonly assigned U.S. Pat. No. 6,177,636, the disclosure of which is hereby incorporated by reference herein, discloses a method and apparatus for providing interconnections between a microelectronic device and a supporting substrate. In one preferred embodiment of the '636 patent, a method of fabricating an interconnection component for a microelectronic device includes providing a flexible chip carrier having first and second surfaces and coupling a conductive sheet to the first surface of the chip carrier. The conductive sheet is then selectively etched to produce a plurality of substantially rigid posts. A compliant layer is provided on the second surface of the support structure and a microelectronic device such as a semiconductor chip is engaged with the compliant layer so that the compliant layer lies between the microelectronic device and the chip carrier, and leaving the posts projecting from the exposed surface of the chip carrier. The posts are electrically connected to the microelectronic device. The posts form projecting package terminals that can be engaged in a socket or solder-bonded to features of a substrate as, for example, a circuit panel. Because the posts are movable with respect to the microelectronic device, such a package substantially accommodates thermal coefficient of expansion mismatches between the device and a supporting substrate when the device is in use. Moreover, the tips of the posts can be coplanar or nearly coplanar.

Despite all of the above-described advances in the art, still further improvements in making and testing microelectronic packages such as semiconductor chip packages and wafer level packages would be desirable.

SUMMARY OF THE INVENTION

In certain preferred embodiments of the present invention, microelectronic packages have dual diameter conductive posts or pins. Each of the conductive posts desirably includes a large diameter conductive base affixed to a flexible dielectric layer or wafer and small diameter conductive tip disposed atop the conductive base. In preferred embodiments, the base and the tip have cylindrical shapes. In more preferred embodiments, the dual diameter conductive post structure includes two concentric cylinders in which the upper cylinder (i.e. the tip) has a greater height than the lower cylinder (i.e. the base). The microelectronic packages preferably include a conductive feature for making electrical connection between the conductive base and a wiring trace on the flexible dielectric layer or wafer. The conductive feature preferably extends between a bottom surface of the conductive base and the wiring trace. Moreover, the conductive feature desirably has a diameter that is smaller than the diameter of the conductive base. The use of the relatively small diameter conductive feature for electrically interconnecting the conductive base with the wiring trace decreases the conductive area of the wiring trace occupied by the conductive base of the post and thereby enables a higher wiring density to be provided on the flexible dielectric layer.

In preferred embodiments, the larger diameter base insures a good mechanical joint between the base and the dielectric layer. As is well known to those skilled in the art, a peeling stress occurs between the base and the dielectric layer when the post is forced to pitch or roll. The large diameter base helps distribute the peeling stress and thereby improves the mechanical reliability of the interconnection.

In certain preferred embodiments of the present invention, a microelectronic package includes a microelectronic element such as a semiconductor chip or a semiconductor wafer having contacts, a flexible substrate such as a dielectric substrate spaced from and overlying the microelectronic element, and a plurality of conductive posts extending from the flexible substrate and projecting away from the microelectronic element, the conductive posts being electrically interconnected with the microelectronic element. Each conductive post desirably has a conductive base that is in contact with the flexible substrate and a conductive tip that extends from the base, whereby the base of the conductive post has a larger diameter than the tip of the conductive post. The conductive posts may be connected with the microelectronic element using wire bonds or leads.

In certain preferred embodiments, the bases of the conductive posts have a cylindrical shape and the tips of the conductive posts have a cylindrical shape. In other preferred embodiments, the bases of the conductive posts comprise a first metal and the tips of the conductive posts comprise a second metal that is different than the first metal. In still further preferred embodiments, each part of the dual diameter post may be made of a different metal or conductive non-metal so as to provide conductive posts having different elastic and/or plastic properties. In yet further preferred embodiments of the present invention, the conductive posts may comprise more than one material though the height and/or width of the post. The tips of the conductive posts desirably have a diameter of about 60-100 microns, and more preferably about 80 microns.

In certain preferred embodiments, the microelectronic assembly may include a compliant layer between the microelectronic element and the flexible substrate. The compliant layer may be continuous or discontinuous. The compliant layer may have a plurality of voids extending therethrough or may include a plurality of compliant bumps.

In certain preferred embodiments, the flexible substrate includes a dielectric material. Conductive traces or wiring traces may be provided on top of the flexible substrate, on the bottom of the flexible substrate and/or in between the top and the bottom of the flexible substrate. The conductive traces desirably electrically interconnect at least some of the conductive posts and the microelectronic element.

In one preferred embodiment, the flexible substrate has a first surface facing the microelectronic element and a second surface facing away from the microelectronic element, with the conductive traces overlying the first surface of the flexible substrate. The flexible substrate may have openings extending between the conductive traces and the bases of the conductive posts, the package further comprising conductive elements provided in the openings in the flexible substrate for electrically interconnecting the bases of the conductive posts and the conductive traces. The conductive elements extending through the flexible substrate desirably have diameters that are smaller than the diameters of the tips of the conductive posts.

In certain preferred embodiments, the microelectronic assembly may include a plurality of support elements disposed between the microelectronic element and the flexible substrate for supporting the flexible substrate over the microelectronic element, with at least some of the conductive posts being offset from the support elements. In certain preferred embodiments, at least some of the support elements are electrically conductive for electrically interconnecting some of the conductive posts with the microelectronic element. The support elements may be compliant.

Although the present invention is not limited by any particular theory of operation, it is believed that prior art conductive posts limit the density of wiring traces that may be placed on a flexible dielectric tape or low modulus material on a wafer. For etched pins, this is a consequence of the etching process used for their formation. For formed pins, it is determined by the aspect ratio of holes that can proceed in a thick photo-imageable resist at moderate cost. The posts or pins are grown in the apertures by electroplating or by using other metal deposition methods. The downside of using large diameter bases for the posts is that it limits the surface area that can accommodate a wiring or redistribution trace. In cases where the circuit requires a dense wiring trace, then it is necessary to use a multi-layer approach with vias connecting the buried levels, which increases the cost of manufacture and decreases product reliability. Thus, the present invention seeks to provide high density conductive traces on a flexible dielectric substrate of a package or on low modulus material of a wafer package without compromising the mechanical robustness of the attachment of the conductive posts.

In another preferred embodiment of the present invention, a microelectronic assembly includes a microelectronic element such as a semiconductor chip or wafer having contacts, a flexible substrate such as a dielectric sheet spaced from the microelectronic element, the flexible substrate having a first surface facing the microelectronic element, a second surface facing away from the microelectronic element and vias extending from the first surface to the second surface thereof. The microelectronic assembly desirably includes conductive traces overlying the first surface of the flexible substrate, a compliant layer disposed between the microelectronic element and the first surface of the flexible substrate, and a plurality of conductive posts extending from the second surface of the flexible substrate and projecting away from the microelectronic element. The conductive posts are desirably electrically interconnected with the microelectronic element, each conductive post having a conductive base that is in contact with the first surface of the flexible substrate and a conductive tip that extends from the conductive base.

The base of each conductive post desirably has a larger diameter than the tip of the conductive post. The bases and/or the tips of the conductive posts may be cylindrical. In certain preferred embodiments, the bases of the conductive posts comprise a first metal and the tips of the conductive posts comprise a second metal that is different than the first metal.

In preferred embodiments, the microelectronic assembly includes conductive elements provided in the vias of the flexible substrate for electrically interconnecting the bases of the conductive posts with the conductive traces. The conductive elements extending through the flexible, dielectric substrate desirably have diameters that are smaller than the diameters of the tips of the conductive posts. In certain preferred embodiments, the contacts on the microelectronic element face away from the flexible substrate. In other preferred embodiments, however, the contacts on the microelectronic element face toward the flexible substrate.

In further preferred embodiments of the present invention, a microelectronic assembly includes a microelectronic element such as a semiconductor chip or wafer having a first surface and contacts accessible at the first surface, a compliant layer overlying the first surface of the microelectronic element, and conductive posts overlying the compliant layer and projecting away from the first surface of the microelectronic element. Each of the conductive posts desirably has a conductive base that is in contact with the first surface of the flexible substrate and a conductive tip that extends from the base, whereby the base of the post has a larger diameter than the tip of the conductive post, and whereby the conductive posts are electrically interconnected with the contacts of the microelectronic element. Each of the conductive posts preferably has a height of about 50-300 microns. The tip portion of each post preferably has a height that is greater than the height of the bases of the conductive posts.

The compliant layer may be made of silicones, flexibilized epoxy, polyimides, thermosetting polymers, fluoropolymers and thermoplastic polymers. In certain preferred embodiments, the compliant layer has openings in substantial alignment with the contacts of the microelectronic element. The assembly may include conductive traces passing through the openings in the compliant layer for electrically interconnecting the conductive posts and the contacts of the microelectronic element.

In other preferred embodiments, the compliant layer desirably has a top surface and a sloping surface extending between the top surface of the compliant layer and the first surface of the microelectronic element. The top surface of the compliant layer may be substantially flat. In certain preferred embodiments, the compliant layer has a sloping transition surface extending between the substantially flat top surface of the compliant layer and the first surface of the microelectronic element, whereby the sloping transition surface includes at least one curved surface. The at least one curved surface may include a curved surface extending from the first surface of the microelectronic element.

The microelectronic assembly may include electrically conductive traces that electrically interconnect the conductive posts and the contacts of the microelectronic element. The conductive traces may be made of metal, copper, gold, nickel and alloys, combinations and composites thereof. The conductive traces may extend over the compliant layer.

In other preferred embodiments, the compliant layer may include a plurality of compliant bumps overlying the first surface of the microelectronic element, with at least one of the conductive posts being disposed atop at least one of the compliant bumps.

In yet another preferred embodiment of the present invention, a microelectronic assembly includes a microelectronic element such as a semiconductor chip or wafer having a first surface and contacts accessible at the first surface, a compliant layer overlying the first surface of the microelectronic element, the compliant layer having a top surface spaced from the first surface of the microelectronic element, and conductive posts overlying the top surface of the compliant layer and projecting away from the first surface of the microelectronic element. The compliant layer may include a plurality of compliant bumps with a conductive post being provided atop each of the compliant bumps.

Each conductive post desirably has a conductive base that is in contact with the first surface of the flexible substrate and a conductive tip that extends from the conductive base, with the base of the conductive post having a larger diameter than the tip of the conductive post. In preferred embodiments, the tips of the conductive posts are cylindrical in shape. In yet other preferred embodiments, both the conductive bases and the conductive tips of the conductive posts have cylindrical shapes. The assembly may also include conductive traces electrically interconnecting the conductive posts and the contacts of the microelectronic element.

In certain preferred embodiments, the compliant layer has openings in alignment with the contacts of the microelectronic element. The openings desirably define sloping surfaces of the compliant layer extending from the first surface of the microelectronic element to the top surface of the compliant layer, whereby the conductive traces overlie the sloping surfaces of the compliant layer.

The substrate may be flexible, and may include a dielectric material such as a polyimide. The microelectronic element is desirably electrically interconnected with the substrate, such as by using conductive leads, wires or traces. The microelectronic element may be a semiconductor chip having a front face with contacts and a back face remote therefrom. In certain preferred embodiments, the front face of the semiconductor chip faces the substrate. In other preferred embodiments, however, the front face of the semiconductor chip faces away from the substrate and the back face of the semiconductor chip faces the substrate. A compliant layer may be disposed between the microelectronic element and the substrate. The substrate may include a plurality of dielectric layers, and a plurality of layers of conductive traces may extend through the substrate.

In certain preferred embodiments, at least one of the conductive support elements includes a mass of a fusible material. In other preferred embodiments, at least one of the conductive support elements includes a dielectric core and an electrically conductive outer coating over the dielectric core. The support element may also be elongated, having a length that is greater than its width or diameter.

In another preferred embodiments of the present invention, a microelectronic assembly includes a microelectronic element having faces and contacts, a flexible substrate spaced from and overlying a first face of the microelectronic element, and a plurality of first conductive posts extending from the flexible substrate and projecting away from the first face of the microelectronic element, at least some of the conductive posts being electrically interconnected with the microelectronic element. The assembly also desirably includes a plurality of second conductive posts extending from the flexible substrate and projecting toward the first face of the microelectronic element, the second conductive posts supporting the flexible substrate over the microelectronic element, at least some of the first conductive posts being offset from the second conductive posts.

In another preferred embodiment of the present invention, a microelectronic assembly desirably includes a circuitized substrate having metalized vias extending from a first surface of the substrate toward a second surface of the substrate. The assembly may also include a microelectronic package having conductive posts projecting therefrom, the conductive posts being at least partially inserted into openings of the metalized vias for electrically interconnecting the microelectronic package and the substrate. The microelectronic package may include a microelectronic element having faces and contacts, a flexible substrate spaced from and overlying a first face of the microelectronic element, and a plurality of support elements extending between the microelectronic element and the flexible substrate for spacing the flexible substrate from the microelectronic element. The conductive posts are preferably electrically interconnected with the contacts of the microelectronic element and are provided on a region of the flexible substrate that is located outside a perimeter of the microelectronic element. The conductive posts are desirably movable relative to the contacts of the microelectronic element.

Assemblies in accordance with preferred embodiments of the present invention facilitate testing of microelectronic elements and packages having non-planar contacts and interfaces, and avoids the need for specialized, expensive test equipment. In preferred methods according to this aspect of the present invention, movement of the bases of the conductive posts contribute to movement of the tips of the posts, allowing the tips to engage opposing contact pads even where the contact pads themselves are not coplanar with one another.

In another preferred embodiment of the present invention, a microelectronic assembly includes a bare chip or wafer having contacts on a front face thereof. The bare chip or wafer is juxtaposed with a flexible substrate having conductive posts on a top surface thereof and conductive terminals on a bottom surface thereof. At least some of the conductive posts are not aligned with some of the conductive terminals. The conductive posts are preferably interconnected with the conductive terminals. During assembly, the tip ends of the conductive post are abutted against the contacts of the chip or wafer for electrically interconnecting the chip or wafer with the conductive terminals on the flexible substrate. An encapsulant may be provided between the chip/wafer and the flexible substrate. Conductive elements such as solder balls may be provided in contact with the conductive terminals. The misalignment of the conductive terminals with the conductive posts provides compliancy to the package and enables the conductive terminals to move relative to the chip/wafer. In certain preferred embodiments, the conductive posts have an outer layer of gold that is pressed directly against the chip contacts. In other preferred embodiments, the electrical interconnection between the conductive posts and the contacts is formed using an anisotropic conductive film or an anisotropic conductive paste, whereby the conductive particles are disposed between the conductive posts and the contacts. In another preferred embodiment of the present invention, the encapsulant for holding the chip/wafer and the flexible substrate together includes a non-conductive film or paste.

These and other preferred embodiments of the present invention will be described in more detail below.

BRIEF DESCRIPTION OF THE DRAWINGS

FIGS. 11A and 11B show a method of testing the microelectronic assembly of FIG. 9D.

DETAILED DESCRIPTION OF PREFERRED EMBODIMENTS

Figure 1:
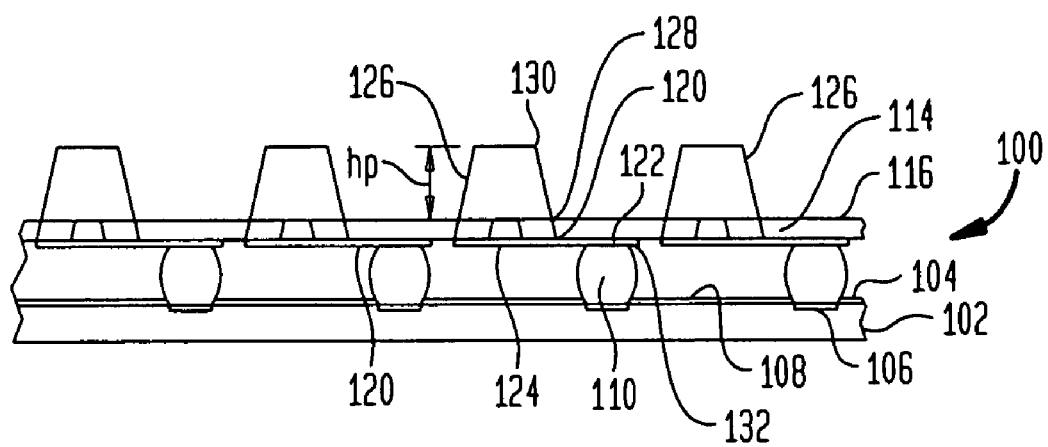
FIG. 1 is a diagrammatic sectional view of a package, in accordance with one preferred embodiment of the present invention.

Referring to FIG. 1, in accordance with one preferred embodiment of the present invention, a microelectronic package 100 includes a microelectronic element, such as a semiconductor chip 102, having a front or contact bearing face 104 and electrical contacts 106 exposed at face 104. A passivation layer 108 may be formed over the contact bearing face 104 with openings at contacts 106.

Figure 2:
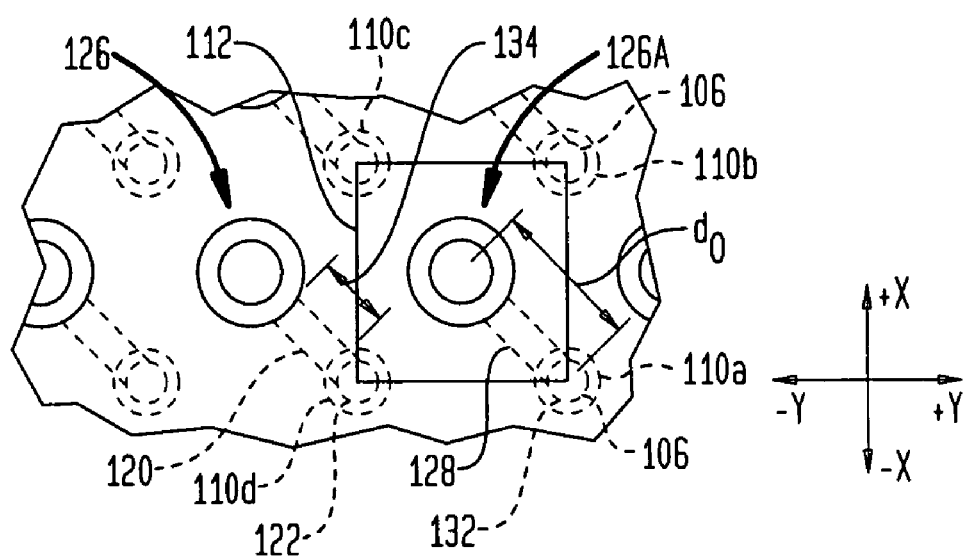
FIG. 2 is a fragmentary plan view of the package shown in FIG. 1.

The microelectronic package 100 also includes conductive support elements 110 such as solder balls in substantial alignment and electrically interconnected with contacts 106. As best seen in FIG. 2, contacts 106 and support elements 110 are disposed in an array which in this case is a rectilinear grid, having equally spaced columns extending in a first horizontal direction x and equally spaced rows extending in a second horizontal direction y orthogonal to the first horizontal direction. Each contact 106 and support element 110 is disposed at an intersection of a row and a column, so that each set of four support elements 110 at adjacent intersections, such as support elements 110a, 110b, 110c and 110d, defines a generally rectangular, and preferably square, zone 112. The directions referred to in this disclosure are directions in the frame of reference of the components themselves, rather than in the normal gravitational frame of reference. Horizontal directions are directions parallel to the plane of the front surface 104 of the chip, whereas vertical directions are perpendicular to that plane.

The package also includes a flexible dielectric substrate 114, such as a polyimide or other polymeric sheet, including a top surface 116 and a bottom surface 118 remote therefrom. Although the thickness of the dielectric substrate will vary with the application, the dielectric substrate most typically is about 10 μm-100 μm thick. The flexible sheet 114 has conductive traces 120 thereon. In the particular embodiment illustrated in FIG. 1, the conductive traces are disposed on the bottom surface 118 of the flexible sheet 114. In other preferred embodiments, however, the conductive traces 120 may extend on the top surface 116 of the flexible sheet 114, on both the top and bottom faces or within the interior of the flexible substrate 114. Thus, as used in this disclosure, a statement that a first feature is disposed "on" a second feature should not be understood as requiring that the first feature lie on a surface of the second feature. Conductive traces 120 may be formed from any electrically conductive material, but most typically are formed from copper, copper alloys, gold or combinations of these materials. The thickness of the traces will also vary with the application, but typically is about 5 μm-25 μm. Traces 120 are arranged so that each trace has a support end 122 and a post end 124 remote from the support end.

Electrically conductive posts or pillars 126 project from the top surface 116 of flexible substrate 114. Each post 126 is connected to the post end 124 of one of the traces 120. In the particular embodiment of FIGS. 1 and 2, the posts 126 extend upwardly through the dielectric sheet 114, from the post ends of the traces. The dimensions of the posts can vary over a significant range, but most typically the height $h_p$ of each post above the top surface 116 of the flexible sheet is about 50-300 μm. Each post has a base 128 adjacent the flexible sheet 114 and a tip 130 remote from the flexible sheet. In the particular embodiment illustrated, the posts are generally frustoconical, so that the base 128 and tip 130 of each post are substantially circular. The bases of the posts typically are about 100-600 μm in diameter, whereas the tips typically are about 40-200 μm in diameter. The posts may be formed from any electrically conductive material, but desirably are formed from metallic materials such as copper, copper alloys, gold and combinations thereof. For example, the posts may be formed principally from copper with a layer of gold at the surfaces of the posts.

The dielectric sheet 114, traces 120 and posts 126 can be fabricated by a process such as that disclosed in co-pending, commonly assigned U.S. Provisional Patent Application Ser. No. 60/508,970, the disclosure of which is incorporated by reference herein. As disclosed in greater detail in the '970 application, a metallic plate is etched or otherwise treated to form numerous metallic posts projecting from the plate. A dielectric layer is applied to this plate so that the posts project through the dielectric layer. An inner or side of the dielectric layer faces toward the metallic plate, whereas the outer side of the dielectric layer faces towards the tips of the posts. The dielectric layer may be fabricated by coating a dielectric such as polyimide onto the plate around the posts or, more typically, by forcibly engaging the posts with the dielectric sheet so that the posts penetrate through the sheet. Once the sheet is in place, the metallic plate is etched to form individual traces on the inner side of the dielectric layer. Alternatively, conventional processes such as plating may form the traces or etching, whereas the posts may be formed using the methods disclosed in commonly assigned U.S. Pat. No. 6,177,636, the disclosure of which is hereby incorporated by reference herein. In yet another alternative, the posts may be fabricated as individual elements and assembled to the flexible sheet in any suitable manner, which connects the posts to the traces.

As best appreciated with reference to FIG. 2, the support ends 122 of the leads are disposed in a regular grid pattern corresponding to the grid pattern of the support elements, whereas the posts 126 are disposed in a similar grid pattern. However, the grid pattern of the posts is offset in the first and second horizontal directions x and y from the grid pattern of the support ends 122 and support elements 110, so that each post 126 is offset in the −y and +x directions from the support end 122 of the trace 120 connected to that post.

The support end 122 of each trace 120 overlies a support element 110 and is bonded to such support element, so that each post 126 is connected to one support element. In the embodiment illustrated, where the support elements are solder balls, the bonds can be made by providing the support elements on the contacts 106 of the chip and positioning the substrate or flexible sheet 114, with the posts and traces already formed thereon, over the support elements and reflowing the solder balls by heating the assembly. In a variant of this process, the solder balls can be provided on the support ends 122 of the traces. The process steps used to connect the support ends of the traces can be essentially the same used in flip-chip solder bonding of a chip to a circuit panel.

As mentioned above, the posts 126 are offset from the support elements 110 in the x and y horizontal directions. Unless otherwise specified herein, the offset distance do (FIG. 2) between a post and a support element can be taken as the distance between the center of area of the base 128 (FIG. 1) of the post and the center of area of the upper end 132 (FIG. 1) of the support element 110. In the embodiment shown, where both the base of the post and the upper end of the support element have circular cross-sections, the centers of area lie at the geometric centers of these elements. Most preferably, the offset distance do is large enough that there is a gap 134 (FIG. 2) between adjacent edges of the base of the post and the top end of the support element. Stated another way, there is a portion of the dielectric sheet 114 in gap 134, which is not in contact with either the top end 132 of the support element or the base 128 of the post.

Each post lies near the center of one zone 112 defined by four adjacent support elements 110, so that these support elements are disposed around the post. For example, support elements 110a-110d are disposed around post 126A. Each post is electrically connected by a trace and by one of these adjacent support elements to the microelectronic device 102. The offset distances from a particular post to all of the support elements adjacent to that post may be equal or unequal to one another.

In the completed unit, the upper surface 116 of the substrate or flexible sheet 114 forms an exposed surface of the package, whereas posts 126 project from this exposed surface and provide terminals for connection to external elements.

The conductive support elements 110 create electrically conductive paths between the microelectronic element 102 and the flexible substrate 114 and traces 120. The conductive support elements space the flexible substrate 114 from the contact bearing face 104 of microelectronic element 102. As further discussed below, this arrangement facilitates movement of the posts 126.

Figure 3:
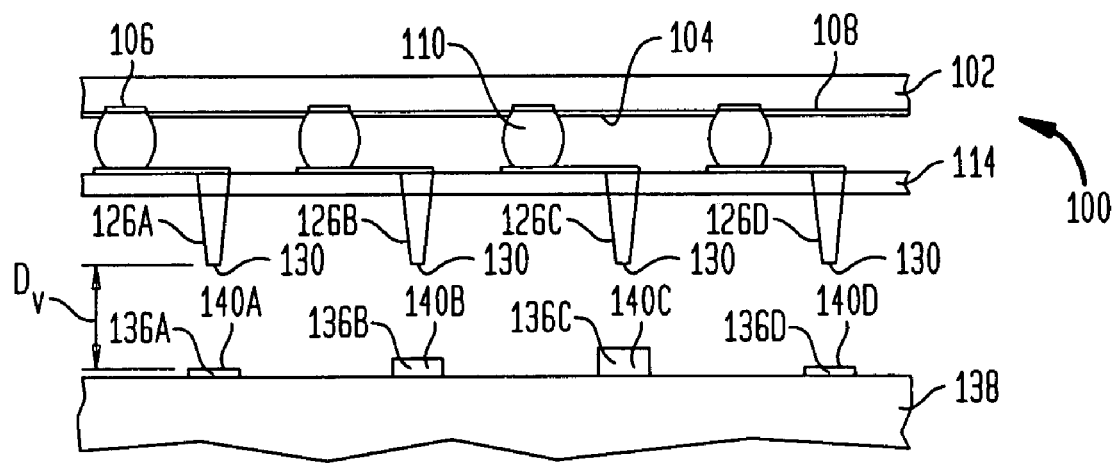
FIG. 3 is a diagrammatic elevational view depicting the package of FIGS. 1 and 2 in conjunction with a test circuit panel during one step of a method, in accordance with one preferred embodiment of the present invention.

Referring to FIG. 3, in a method of operation according to a further embodiment of the invention, a microelectronic package 100 such as the package discussed above with reference to FIGS. 1 and 2 is tested by juxtaposing the conductive posts 126 with contact pads 136 on a second microelectronic element 138 such as a circuitized test board. The conductive posts 126A-126D are placed in substantial alignment with top surfaces of the respective contact pads 136A-136D. As is evident in the drawing figure, the top surfaces 140A-140D of the respective contact pads 136A-136D are disposed at different heights and do not lie in the same plane. Such non-planarity can arise from causes such as warpage of the circuit board 138 itself and unequal thicknesses of contact pads 136. Also, although not shown in FIG. 3, the tips 130 of the posts may not be precisely coplanar with one another, due to factors such as unequal heights of support elements 110; non-planarity of the front surface 104 of the microelectronic device; warpage of the dielectric substrate 114; and unequal heights of the posts themselves. Also, the package 100 may be tilted slightly with respect to the circuit board. For these and other reasons, the vertical distances Dv between the tips of the posts and the contact pads may be unequal.

Figure 4:
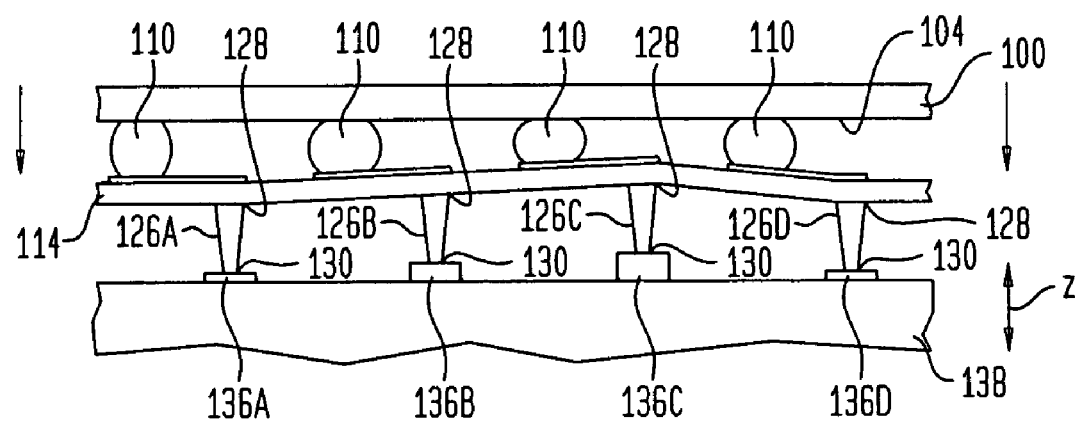
FIG. 4 is a view similar to FIG. 3 but depicting a later stage of the method.

Referring to FIG. 4, the microelectronic package 100 is moved toward the test board 138, by moving the test board, the package or both. The tips 130 of the conductive posts 126A-126D engage the contact pads 136 and make electrical contact with the contact pads. The tips of the posts are able to move so as to compensate for the initial differences in vertical spacing Dv (FIG. 3), so that all of the tips can be brought into contact with all of the contact pads simultaneously using only a moderate vertical force applied to urge the package and test board 138 together. In this process, at least some of the post tips are displaced in the vertical or z direction relative to other post tips.

A significant portion of this relative displacement arises from movement of the bases 128 of the posts relative to one another and relative to microelectronic element 100. Because the posts are attached to flexible substrate 114 and are offset from the support elements 110, and because the support elements space the flexible substrate 114 from the front surface 104 of the microelectronic element, the flexible substrate can deform. Further, different portions of the substrate associated with different posts can deform independently of one another.

Figure 5:
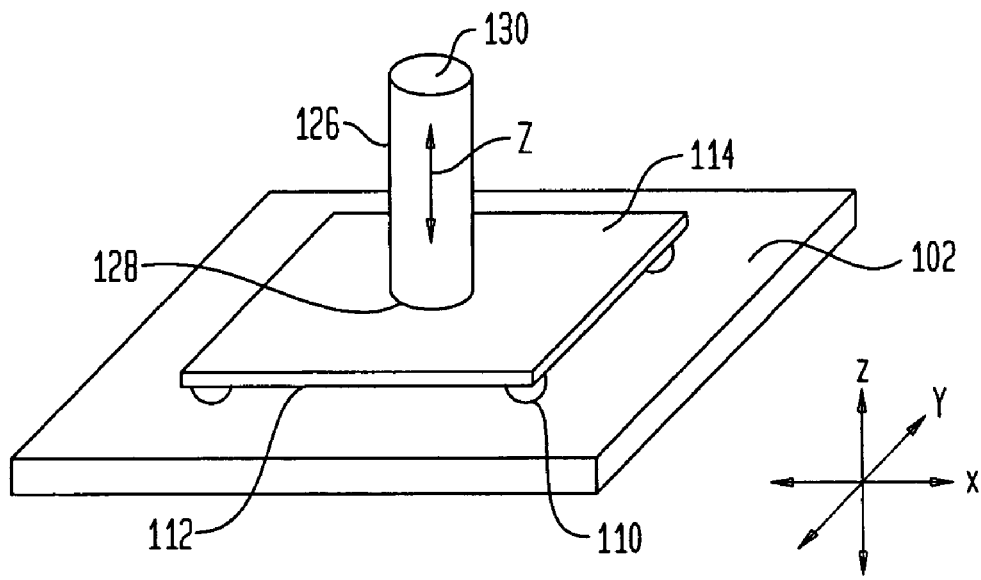
FIG. 5 is a diagrammatic, idealized perspective view depicting a portion of the package shown in FIGS. 1-4.

An idealized representation of the deformation of a single region 112 of substrate 114 is shown in FIG. 5. The support elements 110 disposed at the corners of the region allow the central part of the region to bend downwardly toward the microelectronic element 102, allowing the base 128 of post 126 to also move downward toward the microelectronic element. This deformation is idealized in FIG. 5 as a pure displacement of the post and the center of the region in the vertical or z direction. In practice, the deformation of the substrate may include bending and/or stretching of the substrate so that the motion of the base may include a tilting about an axis in the x-y or horizontal plane as well as some horizontal displacement of the base, and may also include other components of motion. For example, one portion of the region may be reinforced by a trace, and will tend to be stiffer than the other portions of the region. Also, a particular post may be positioned off-center in its region 112, so that the post lies closer to one support element, or to a pair of support elements, on one side of the post. For example, post 126a (FIG. 2) may be disposed closer to support elements 110a and 110b than to support elements 110c and 110d. The relatively small portion of the substrate between the post and support elements 110a and 110b will be stiffer in bending than the relatively large portion of the substrate between the posts and support elements 110c and 110d. Such non-uniformities tend to promote non-uniform bending and hence tilting motion of the posts. Tilting of the posts tends to move the tips 130 toward the microelectronic element. The support elements 110 at the corners of the individual regions substantially isolate the various regions from one another, so that the deformation of each region is substantially independent of the deformation of other regions of the substrate 114. Depending on the configuration of the posts, the posts 126 themselves may also flex or buckle to some degree, which provides additional movement of tips 76 in the vertical or z direction.

The independent displacement of the posts relative to one another allows all of the post tips 130 to contact all of the contact pads 136 on the test substrate. For example, the flexible substrate 114 in the vicinity of conductive post 126C flexes substantially more than the flexible substrate in the vicinity of conductive post 126B. In turn, the flexible substrate 114 in the vicinity of conductive post 126B flexes substantially more than the flexible substrate in the vicinity of conductive post 126A.

Because all of the post tips 130 can be engaged reliably with all of the contact pads 136, the package can be tested reliably by applying test signals, power and ground potentials through the test circuit board 138 and through the engaged posts and contact pads. Moreover, this reliable engagement is achieved with a simple test circuit board 138. For example, the contact pads 136 of the test circuit board are simple, planar pads. The test circuit board need not incorporate special features to compensate for non-planarity or complex socket configurations. The test circuit board can be made using the techniques commonly employed to form ordinary circuit boards. This materially reduces the cost of the test circuit board, and also facilitates construction of the test circuit board with traces (not shown) in a simple layout compatible with high-frequency signals. Also, the test circuit board may incorporate electronic elements such as capacitors in close proximity to the contact pads as required for certain high-frequency signal processing circuits. Here again, because the test circuit board need not incorporate special features to accommodate non-planarity, placement of such electronic elements is simplified. In some cases, it is desirable to make the test circuit board as planar as practicable so as to reduce the non-planarity of the system and thus minimize the need for pin movement. For example, where the test circuit board is highly planar a ceramic circuit board such as a polished alumina ceramic structure, only about 20 µm of pin movement will suffice.

The internal features of package 100 are also compatible with high-frequency signals. The conductive support elements, traces and posts provide low-impedance signal paths between the tips of the posts and the contacts 106 of the microelectronic element. Because each post 126 is connected to an immediately adjacent conductive support element 110, traces 120 are quite short. The low-impedance signal paths are particularly useful in high-frequency operation, as, for example, where the microelectronic element must send or receive signals at a frequency of 300 MHz or more.

Figure 6:
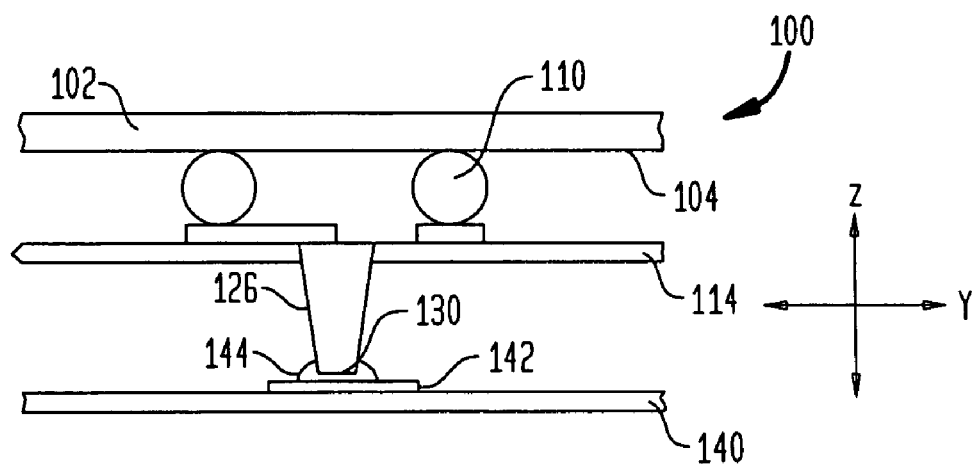
FIG. 6 is a fragmentary sectional view depicting a portion of an assembly including the package of FIGS. 1-5.

Referring to FIG. 6, after testing the microelectronic package 100 may be removed from the test circuit board 138 and permanently interconnected with another substrate such as a circuit panel 140 having contact pads 142. The interconnection may be made by bonding the tips 130 of posts 126 to the contact pads of the circuit panel using a conductive bonding material 144 such as a solder. The solder-bonding process may be performed using conventional equipment commonly used for surface-mounting microelectronic components. Thus, the solder masses may be provided on the posts 126 or on the contact pads 142, and may be reflowed after engaging the posts with the contact pads. During reflow, the surface tension of the solder tends to center the posts on the contact pads. Such self-centering action is particularly pronounced where the tips of the posts are smaller than the contact pads. Moreover, the solder 144 wets the sides of the posts to at least some extent, and thus forms a fillet encircling the tip of each post, as well as a strong bond between the confronting surfaces of the posts and pads.

Moreover, the tips 130 of the posts 126 can move relative to the microelectronic element 102 to at least some degree during service so as to relieve stresses arising from differential thermal expansion and contraction. As discussed above in connection with the testing step, the individual posts 126 can move relative to the microelectronic element and relative to the other posts by flexure or other deformation of substrate 114. Such movement can appreciably relieve stresses in the solder bonds between the posts and the contact pads, which would otherwise occur upon differential thermal expansion or contraction of the circuit board 140 and microelectronic element 102. Moreover, the conductive support elements or solder balls 110 can deform to further relieve stresses in solder masses 144. The assembly is highly resistant to thermal cycling stresses, and hence highly reliable in service.

An underfill material (not shown) such as an epoxy or other polymeric material may be provided around the tips of the posts and around the contact pads, so as to reinforce the solder bonds. Desirably, this underfill material only partially fills the gap between the package 100 and the circuit board 140. In this arrangement, the underfill does not bond the flexible substrate 114 or the microelectronic device to the circuit board. The underfill only reinforces the posts at their joints with the contact pads. However, no reinforcement is required at the bases of the posts, inasmuch as the joint between the base of each post and the associated trace is extraordinarily resistant to fatigue failure.

The assembly is also compact. Some or all of the posts 126 and contact pads 142 are disposed in the area occupied by the microelectronic element 102, so that the area of circuit board 140 occupied by the assembly may be equal to, or only slightly larger than, the area of the microelectronic element itself, i.e., the area of the front surface 104 of the microelectronic element 100.

The foregoing discussion has referred to an individual microelectronic element. However, the package may include more than one microelectronic element or more than one substrate. Moreover, the process steps used to assemble the flexible substrate, support elements and posts to the chips may be performed while the chips are in the form of a wafer. A single large substrate may be assembled to an entire wafer, or to some portion of the wafer. The assembly may be severed so as to form individual units, each including one or more of the chips and the associated portion of the substrate. The testing operations discussed above may be performed prior to the severing step. The ability of the packages to compensate for non-planarity in a test board or in the wafer itself greatly facilitates testing of a large unit.

The substrate and traces may deform locally in regions surrounding the posts. These regions tend to deform upwardly, leaving concavities in the bottom surface of the substrate. The posts may have heads, and these heads may be lodged partially or completely within the concavities. To control deformation of the substrate, the top surface of the substrate may be abutted against a die having holes aligned with locations where posts are forced through the substrate. Such a die can also help to prevent delamination of the substrate and traces. In variants of the process, the traces may be disposed on the top or bottom surface of a single-layer substrate. The resulting post-array substrate can be assembled with a microelectronic element to form a package as discussed above, or can be used in any other microelectronic assembly where a small post array is desirable. The assembly process allows selective placement of posts. It is not essential to provide the lands and holes in the traces. Thus, posts can be placed at any location along any trace. Moreover, the posts may be formed from essentially any conductive material. Different posts may be formed from different materials. For example, posts subject to severe mechanical loading can be formed entirely or partially from hard refractory metals such as tungsten, while other posts may be formed from softer metals such as copper. Also, some or all of the posts may be formed entirely or partially from corrosion-resistant metals such as nickel, gold or platinum.

The dielectric sheet, traces and posts may be fabricated by a process such as that disclosed in co-pending, commonly assigned U.S. Provisional Patent Application Ser. No. 60/508,970, the disclosure of which is hereby incorporated by reference herein. As disclosed in greater detail in the '970 application, a metallic plate is etched or otherwise treated to form numerous metallic posts projecting from the plate. A dielectric layer is applied to this plate so that the posts project through the dielectric layer. An inner face of the dielectric layer faces toward the metallic plate, whereas the outer face of the dielectric layer faces towards the tips of the posts. The dielectric layer may be fabricated by coating a dielectric such as polyimide onto the plate around the posts or, more typically, by forcibly engaging the posts with the dielectric sheet so that the posts penetrate through the sheet. Once the sheet is in place, the metallic plate is etched to form individual traces on the inner side of the dielectric layer. Alternatively, conventional processes such as plating may form the traces or etching, whereas the posts may be formed using the methods disclosed in commonly assigned U.S. Pat. No. 6,177,636, the disclosure of which is hereby incorporated by reference herein. In yet another alternative, the posts may be fabricated as individual elements and assembled to the flexible sheet in any suitable manner, which connects the posts to the traces.

In the completed unit, the upper surface of the substrate or flexible sheet forms an exposed surface of the package, whereas posts project from this exposed surface and provide terminals for connection to external elements.

Figure 7A:
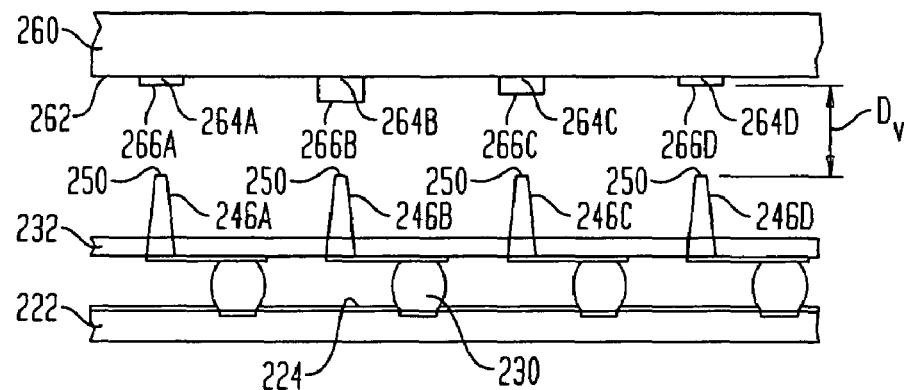
FIG. 7A shows a front elevational view of a testing assembly during a method of testing a microelectronic element, in accordance with one preferred embodiment of the present invention.
Figure 7B:
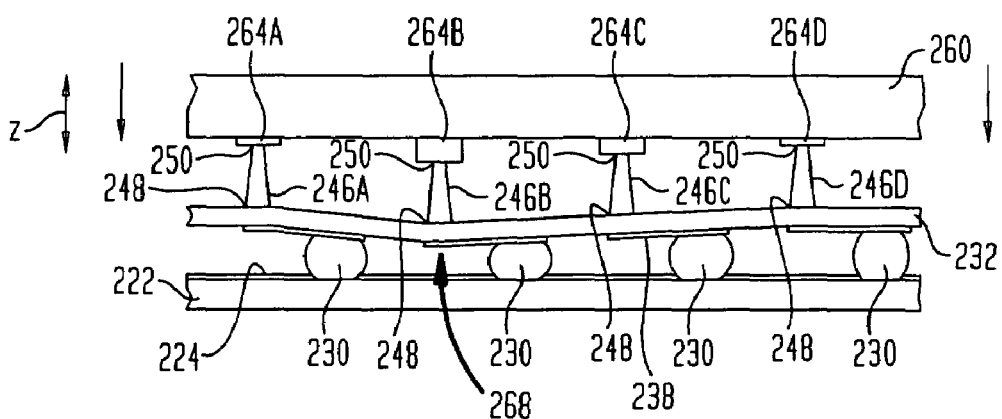
FIG. 7B shows the testing assembly of FIG. 7A during a later stage of testing the microelectronic element.

FIGS. 7A and 7B show a method of testing a microelectronic element 260 using a testing assembly 220. The microelectronic element 260, such as a semiconductor chip, has a front face 262 including contacts 264 accessible at the front face and a rear face 266 remote therefrom. In order to test the microelectronic element 260, the contacts 264 of the microelectronic element are juxtaposed with the conductive posts 246 of the test board 222. The contacts 264A-264D are placed in substantial alignment with top surfaces 250 of the respective conductive posts 246A-246D. As is evident in the drawing figure, the top surfaces 266A-266D of the respective contact pads 264A-264D are disposed at different heights and do not lie in the same plane. Such non-planarity can arise from causes such as warpage of the microelectronic element 260 itself and unequal thicknesses of contact pads 264. Also, although not shown in FIG. 7A, the tips 250 of the posts 246 may not be precisely coplanar with one another, due to factors such as unequal heights of support elements 230; non-planarity of the first surface 224 of the test board 222; warpage of the dielectric substrate 232; and unequal heights of the posts themselves. Also, the microelectronic element 260 may be tilted slightly with respect to the test board. For these and other reasons, the vertical distances Dv between the contacts 264 and the tips of the posts 246 may be unequal.

Referring to FIG. 7B, the microelectronic element 260 is moved toward the test board 222, by moving the test board, the microelectronic element or both toward one another. The contacts 264 engage the conductive posts 246A-246D for making electrical contact with the conductive posts. The tips 250 of the posts 246A-246D are able to move so as to compensate for the initial differences in vertical spacing Dv (FIG. 7A), so that all of the tips can be brought into contact with all of the contact pads simultaneously using with only a moderate vertical force applied to urge the microelectronic element 260 and the test board 222 together. In this process, at least some of the post tips 246A-246D are displaced in the vertical or z direction relative to others of the post tips.

A significant portion of this relative displacement arises from movement of the bases 248 of the posts relative to one another and relative to test board 220. Because the posts are attached to flexible substrate 232 and are offset from the support elements 230, and because the support elements space the flexible substrate 232 from the first surface 224 of the test board, the flexible substrate 232 can deform. Further, different portions of the substrate associated with different posts can deform independently of one another. As pressure is applied by contacts 264 onto the posts 246, the support elements 230 allow region 268 of flexible substrate 232 to bend downwardly toward the test board 222, allowing the base 248 of post 246B to also move downward toward the test board. This deformation is idealized in FIG. 7B as a pure displacement of the post and the center of the region in the vertical or z direction. In practice, the deformation of the substrate 232 may include bending and/or stretching of the substrate so that the motion of the base may include a tilting about an axis in the x-y or horizontal plane as well as some horizontal displacement of the base, and may also include other components of motion. For example, one portion of the region may be reinforced by a conductive trace (not shown), which will tend to be stiffer than the other portions of the region. Also, a particular post may be positioned off-center in its region 268, so that the post lies closer to one support element 230, or to a pair of support elements, on one side of the post. For example, post 246a may be disposed closer to support elements 230a and 230b than to support elements 230c and 230d. The relatively small portion of the substrate between the post and support elements 230a and 230b will be stiffer in bending than the relatively large portion of the substrate between the posts and support elements 230c and 230d. Such non-uniformities tend to promote non-uniform bending and hence tilting motion of the posts. Tilting of the posts tends to move the tips 250 toward the test board 222. The support elements 230 at the corners of the individual regions substantially isolate the various regions from one another, so that the deformation of each region is substantially independent of the deformation of other regions of the flexible, dielectric substrate 232. Depending on the configuration of the posts, the posts 246 themselves may also flex or buckle to some degree, which provides additional movement of tips 250 in the vertical or z direction.

Referring to FIG. 7B, the independent displacement of the posts 246 relative to one another allows all of the contacts 264 of the microelectronic element 260 to contact all of the post tips 250 on the test board 222. For example, the flexible substrate 232 in the vicinity of conductive post 246B flexes substantially more than the flexible substrate in the vicinity of conductive post 246C. In turn, the flexible substrate 232 in the vicinity of conductive post 246C flexes substantially more than the flexible substrate in the vicinity of conductive post 246D.

Because all of the contacts 264 can be engaged reliably with all of the post tips 250, the microelectronic element 260 can be tested reliably by applying test signals, power and ground potentials through the test board 222 and through the engaged contacts and posts.

The test circuit board can be made using the techniques commonly employed to form ordinary circuit boards. The test circuit board may incorporate electronic elements such as capacitors in close proximity to the contact pads as required for certain high-frequency signal processing circuits. The internal features of the microelectronic element 260 are also compatible with high-frequency signals. The conductive support elements 230, traces 238 and posts 246 provide low-impedance signal paths between the tips 250 of the posts and the contacts 264 of the microelectronic element 260. Because each post 246 is connected to an immediately adjacent conductive support element 230, traces 238 may be quite short. The low-impedance signal paths are particularly useful in high-frequency operation, as, for example, where the microelectronic element must send or receive signals at a frequency of 300 MHz or more.

After testing, the microelectronic element 260 may be removed from the testing assembly 220 and packaged using an interposer such as a circuitized, dielectric film. The microelectronic package, such as a ball grid array package, may be connected with contact pads on a circuit panel using a conductive bonding material such as solder. The solder-bonding process may be performed using conventional equipment commonly used for surface-mounting microelectronic components. Thus, the solder masses may be provided on the terminals of the microelectronic package, and may be reflowed after engaging the terminals with the conductive pads.

Figure 8:
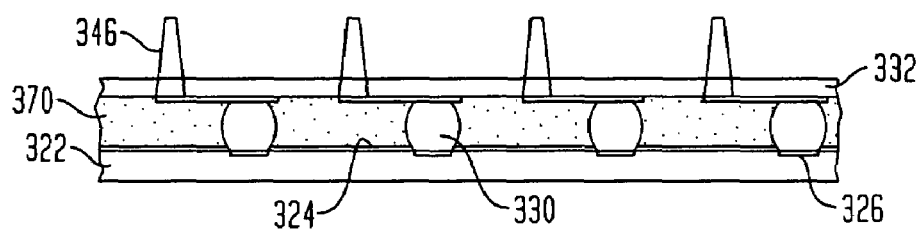
FIG. 8 shows a cross-sectional view of an assembly for testing microelectronic elements, in accordance with another preferred embodiment of the present invention.

Referring to FIG. 8, in certain preferred embodiments of the present invention, a testing assembly 320 has a compliant material 370 positioned between a flexible substrate 332 and a test board 322. The compliant material layer 370 preferably does not substantially restrict movement of conductive posts 346. The compliant material desirably prevents contaminants from entering the testing assembly 320. Merely by way of example, the compliant material 370 may be a gel, foam or the like. Despite the presence of the compliant material, conductive elements 330 still support the flexible substrate 332 to a substantial degree.

Figure 9A:
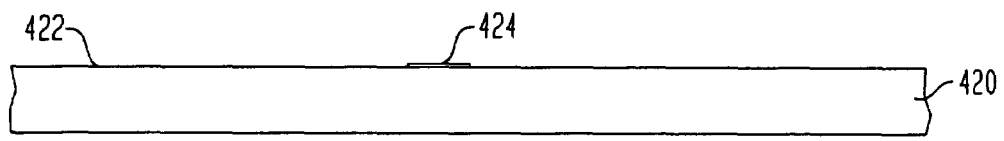
FIG. 9A is a cross-sectional view of a microelectronic element having one or more contacts, in accordance with certain preferred embodiments of the present invention.

FIG. 9A shows a semiconductor wafer 420 having a plurality of die or chips, in accordance with another preferred embodiment of the present invention. The wafer has a first face or contact bearing face 422 with one or more contacts 424 accessible at the first face 422. The wafer may be singulated into individual chip packages at any point during the fabrication process disclosed herein. In other preferred embodiments, the wafer 420 may be replaced by a single microelectronic chip. A dielectric passivation layer (not shown) may be deposited or adhered onto the contact bearing face 422 of the wafer 420. The passivation layer may be a $SiO_2$ passivation layer commonly found on the contact-bearing surface of semiconductor chips. In another preferred embodiment, a separate dielectric passivation layer may be used such as an epoxy resin, polyimide resin, photo-imageable dielectric, etc. When the separate passivation layer is used, the passivation layer may be spun onto and built up to a planar, sheet-like form on the face surface, or the dielectric sheet may be laminated to the face surface using any one of the electronic grade adhesives commonly known and used by those skilled in the art. The passivation layer preferably covers the contact bearing face 422 of the wafer and leaves the contacts 424 exposed so that a conductive element such as an elongated bond ribbon may be plated thereon in a later step, as described below.

Figure 9B:
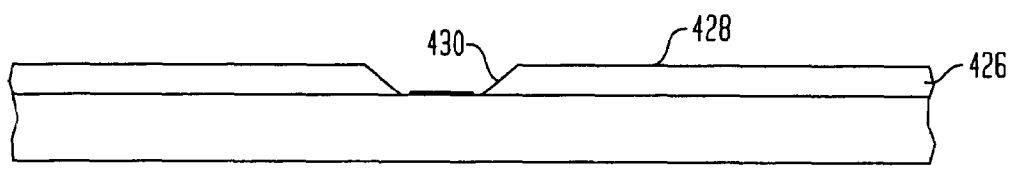
FIG. 9B is a cross-sectional view of the microelectronic element of FIG. 9A after a compliant layer has been formed over the contact-bearing surface of the microelectronic element.

Referring to FIG. 9B, a compliant layer 426 is deposited or laminated onto the exposed surface of the passivation layer (not shown). The compliant layer may be formed and/or have a shape as disclosed in commonly assigned U.S. Pat. Nos. 6,211,572; 6,284,563; 6,465,878; 6,847,101 and 6,847,107, and co-pending U.S. application Ser. Nos. 09/020,647 and 10/873,883, the disclosures of which are hereby incorporated by reference herein. [TESSERA 078 line of cases] The compliant layer 426 may be stenciled, screened or transfer molded on a passivation layer using a curable liquid which, when cured, adheres to the passivation layer. Alternatively, the compliant layer 426 may be adhered to the exposed surface of the passivation layer in the form of cured compliant pads using an electronic grade adhesive. The compliant layer 426 preferably has a substantially flat top surface 428 and a gradual, sloping transition surface 430 between the contact bearing face 422 of the wafer 420 and the top surface 428 of the compliant layer. The sloping transition surface 430 may follow a line of curvatures between the contact bearing face 426 and the substantially flat top surface 428 or may simply be canted at an angle such that the sloping surface 430 is not too vertically oriented in relation to the contact bearing surface 422 and the substantially flat surface 428. The compliant layer 426 may be formed from a wide variety of materials, such as a low modulus of elasticity material. The compliant layer may also be fabricated of polymeric and other materials such as silicones, flexibilized epoxies, polyimides and other thermosetting polymers, fluoropolymers and thermoplastic polymers.

A plating seed layer (not shown) may be deposited atop the aforementioned assembly. The seed layer may be deposited using a sputtering operation. Typical plating seed layer materials include palladium (for electroless plating), titanium, tungsten nickel and chromium. In other preferred embodiments, however, primarily copper seed layers are used.

Figure 9C:
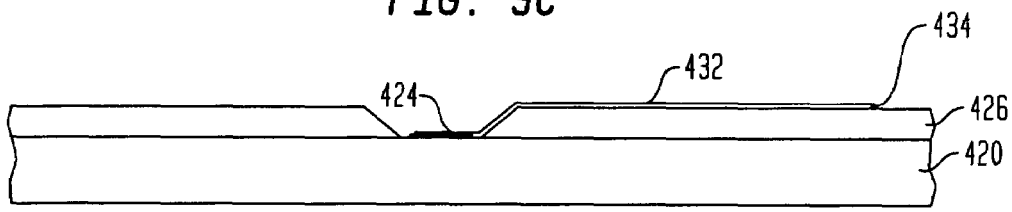
FIG. 9C is a cross-sectional view of the micro electronic subassembly shown in the FIG. 9B after elongated conducted traces have been formed atop the compliant layer.

Referring to FIG. 9C, a photoresist (not shown) may be applied to the exposed top surface of the compliant layer 426 and then exposed and developed for forming elongated, electrically conductive bond ribbons or traces 432 that form electrically conductive pads. The electrically conductive bond ribbons preferably electrically interconnect the chip contacts 424 near a first end of the conductive ribbons 432 and terminals 434 near a second end of the electrically conductive bond ribbons 432. The bond ribbons may be plated directly onto the contacts 424. Preferred bond ribbons materials include copper, gold, nickel and alloys, combinations and composites thereof.

Figure 9D:
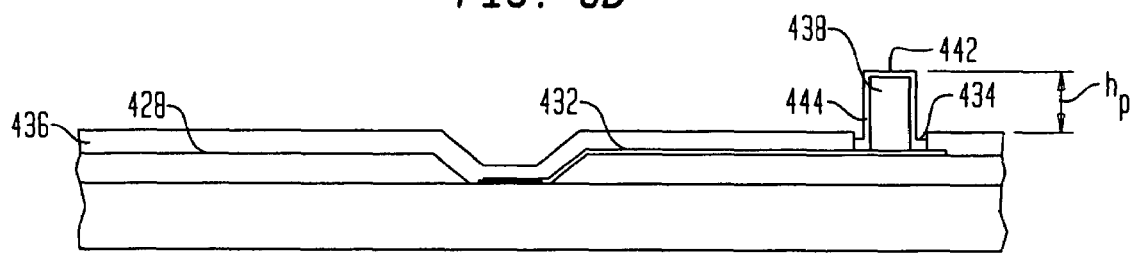
FIG. 9D is a cross-sectional view of the microelectronic subassembly of FIG. 9C after conductive posts or pins have been formed atop the elongated conductive traces shown in FIG. 9C.

Referring to FIG. 9D, a masking layer 436 may be deposited or laminated over the top of the assembly so that only the terminals 434 are exposed. The masking layer may be a dielectric material. The solder mask may comprise a screened, exposed and developed or laminated sheet, a photo-resisting material or may comprise a paralyne epoxy resin, polyimide resin, fluoropolymer, etc., which is deposited or laminated onto the assembly.

Conductive posts or pins 438 are desirably formed atop each of the conductive terminals 434. The conductive posts or pins may be plated or deposited so that they project above the contact bearing face 422 of the semiconductor wafer 420 or chip. In certain preferred embodiments, each conductive post 438 is preferably connected to the terminal end 434 of the conductive trace 432. The dimensions of the posts may vary over a significant range. In certain preferred embodiments, the posts have a height $h_p$ above the top surface 428 of the compliant layer 426 of about 50-300 micrometers. Each post has a base 440 adjacent the compliant layer and a tip 442 remote from the compliant layer. The conductive posts 438 may be formed from any electrically conductive materials, but desirably are formed from metallic materials such as copper, copper alloys, gold and combinations thereof. For example, the conductive posts 438 may be formed from copper with a layer of gold 444 provided at the surfaces of the posts 438.

In certain preferred embodiments, conventional processes such as plating may form the conductive traces and the conductive posts may be formed using the methods disclosed in commonly assigned U.S. Pat. No. 6,177,636, the disclosure of which is hereby incorporated by reference herein. In yet other preferred embodiments, the conductive posts may be fabricated as individual elements and assembled to the microelectronic assembly in any suitable manner that connects the conductive posts to the terminal ends of the conductive traces 432. In still other preferred embodiments, the assembly may be formed by depositing a seed layer, plating conductive traces having first ends connected with the contacts of the microelectronic element and second ends disposed atop the compliant layer, plating the conductive posts atop the compliant layer and in contact with the conductive traces and removing the seed layer. The assembly may also be formed by electrolessly plating the conductive posts. The conductive posts may be formed by electrolessly plating the posts using copper or nickel.

Figure 10:
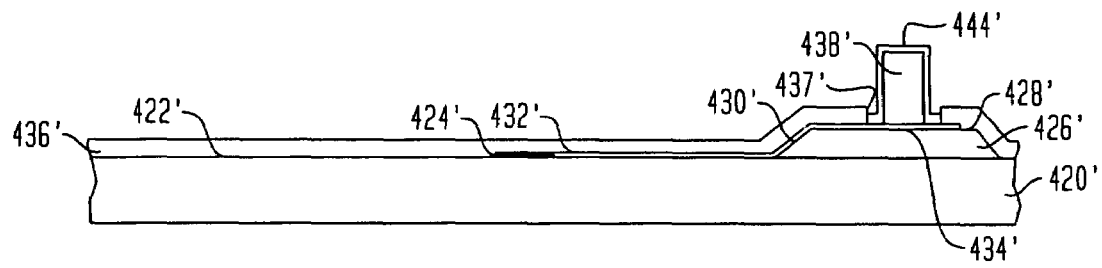
FIG. 10 shows a cross-sectional view of a microelectronic assembly, in accordance with another preferred embodiment of the present invention.

Referring to FIG. 10, in other preferred embodiments of the present invention, a microelectronic assembly includes a semiconductor chip 420' having a contact bearing face 422' with chip contacts 424'. One or more bumps of a compliant material 426' are formed atop the contact bearing face 4221 of the semiconductor chip 420'. In certain preferred embodiments, one or more of the compliant bumps 4261 may include a substantially flat top surface 428' and a sloping surface 430' that transitions between the top surface 428' and the contact bearing surface 422' of the semiconductor chip 4201. One or more conductive bond ribbons 432' are formed atop the assembly. Each conductive bond ribbon 432' has a first end electrically interconnected with the contact 4241 and a second terminal end 434' that overlies the substantially flat top surface 428' of the compliant bump 426'. A masking layer 436' may be provided over the top of the microelectronic subassembly. The masking layer 436' includes openings 437'. The terminal ends 434' the conductive traces 432' are exposed through the openings 437'. One or more conductive posts 438' are formed atop the subassembly. Each conductive post 438' is preferably electrically interconnected with the terminal end 434' of the conductive trace 432'. The conductive posts may be covered with a layer gold 444'.

Figure 11B:
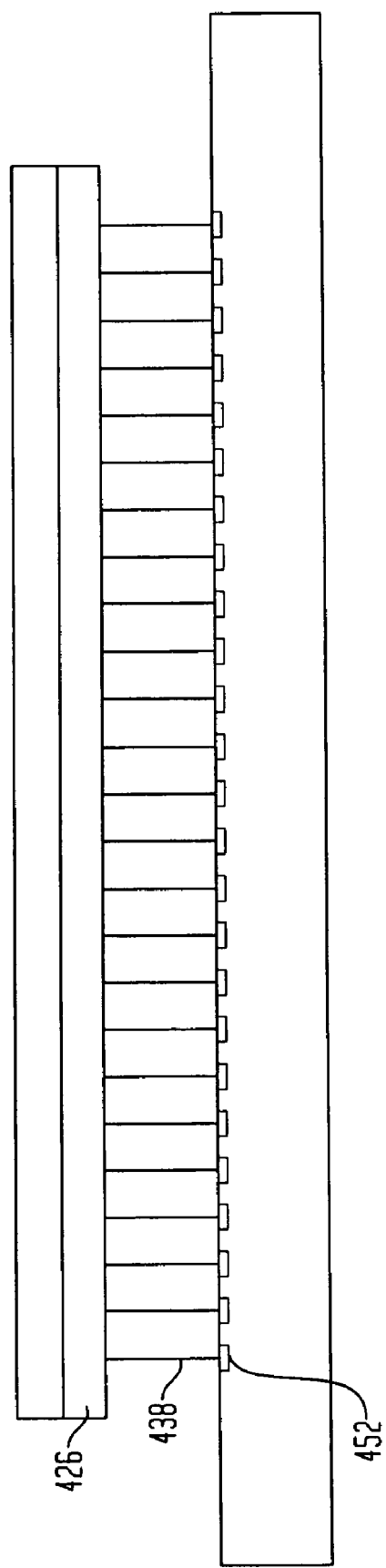

Referring to FIG. 11A, the microelectronic assembly of FIG. 9D may be tested using a substrate 450, such as a printed circuit board, having conductive pads 452. The illustration of the microelectronic assembly shown in FIGS. 11A and 11B has been simplified for clarity. The microelectronic assembly includes wafer 420 having a first face 422 and a compliant layer 426 overlying the first face 422 of the wafer 420. Conductive posts 430 project from the top surface 428 of the compliant layer 426. The conductive posts 438 are electrically interconnected with contacts on the wafer 420.

Referring to FIGS. 11A and 11B, in order to test the microelectronic assembly, the tips 442 of the conductive posts 438 are juxtaposed with the conductive pads 452 of the circuitized substrate 450. As shown in FIG. 11B, the tips of the conductive posts are pressed against the conductive pads. The compliant layer 426 enables the tips of the conductive posts to move relative to the contacts on the wafer to accommodate for non-planarities between the posts and the conductive pads, as well as for thermal mismatch. If the test of the microelectronic assembly is successful, the assembly may be permanently attached to a substrate such as a printed circuit board, such as by using solder or another fusible or conductive material.

Figure 12A:
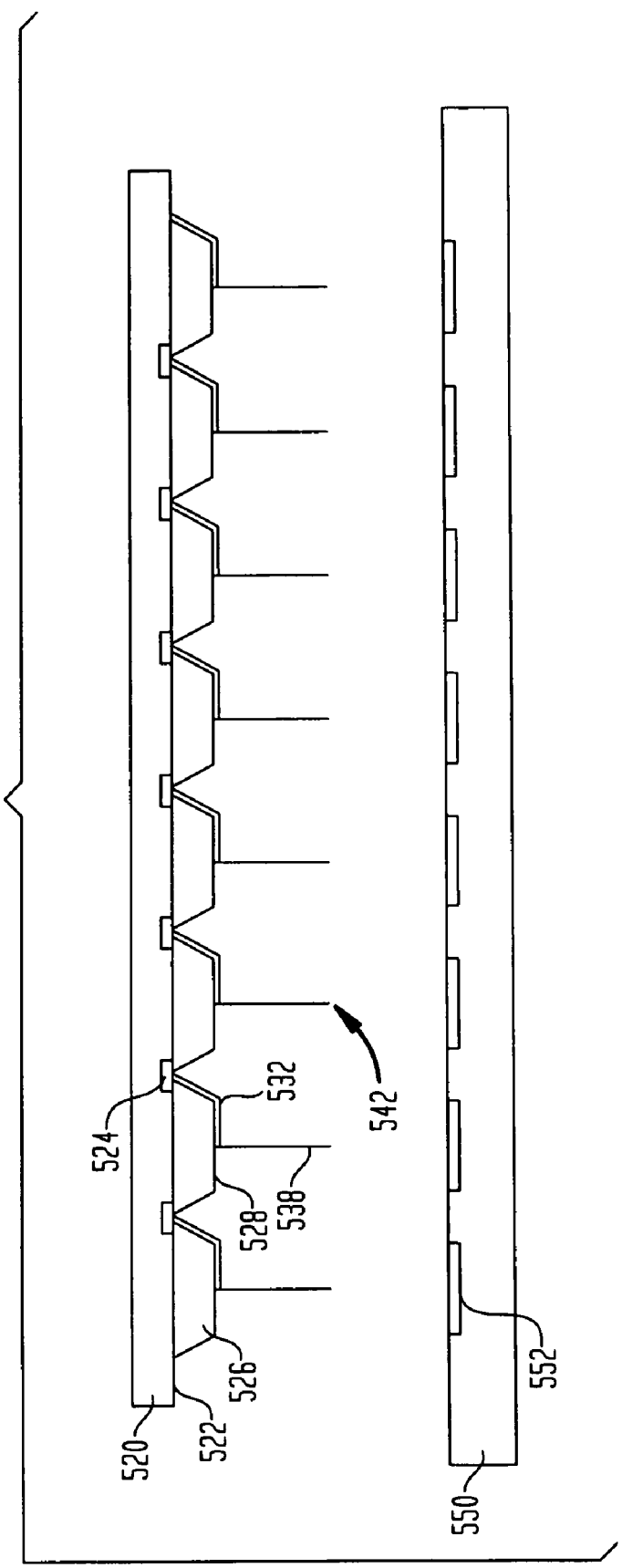
FIGS. 12A and 12B show a method of testing the microelectronic assembly of FIG. 10.

Referring to FIG. 12A, a microelectronic assembly similar to the assembly shown in FIG. 10 may be tested using a substrate 550, such as a test board, having conductive pads 552. The representation of the microelectronic assembly shown in FIGS. 12A and 12B has been simplified for clarity of illustration. The microelectronic assembly includes wafer 520 having a first face 522 and compliant bumps 526 overlying the first face 522 of the wafer 520. Conductive posts 538 project from the top surfaces 528 of the compliant bumps 526. The conductive posts 538 are electrically interconnected with contacts 524 on the wafer 520 by conductive traces 532. The conductive traces preferably overlie the compliant bumps. The conductive traces are preferably in contact with the compliant bumps. In certain preferred embodiments, the conductive traces are in contact with the compliant bumps and overlie the sloping edges of the compliant bumps. The tips of the conductive posts are preferably the highest part of the microelectronic assembly so that the tips are the first part of the assembly to engage the conductive pads on the test board. The conductive posts may have any height so long as the height is higher than the solder mask formed atop the compliant layer or compliant bumps and/or so long as the tips of the posts define the highest point of the assembly. As a result, the tips of the conductive posts may directly engage the conductive pads on a test board during a testing operation, without requiring additional materials such as solder or conductive links/bridges.

Figure 12B:
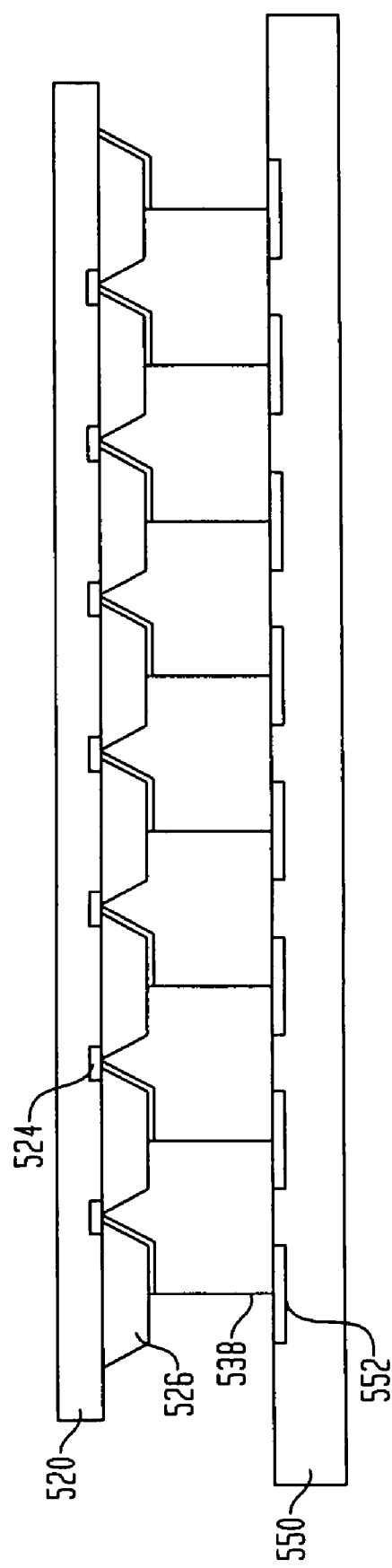

Referring to FIGS. 12A and 12B, in order to test the microelectronic assembly, the tips 542 of the conductive posts 538 are juxtaposed with the conductive pads 552 of the circuitized substrate 550. As shown in FIG. 12B, the tips of the conductive posts 538 are pressed against the conductive pads 552 for forming an electrical interconnection between the microelectronic assembly and the substrate 550. The compliant bumps 526 enable the conductive posts 538 to move relative to the contacts 524 on the wafer 520 to accommodate for non-planarities between the posts 538 and the conductive pads 552 on the test substrate, as well as for thermal mismatch. If the test of the microelectronic assembly is successful, the assembly may be permanently attached to a substrate such as a printed circuit board by using solder or another fusible or conductive material.

Figure 13:
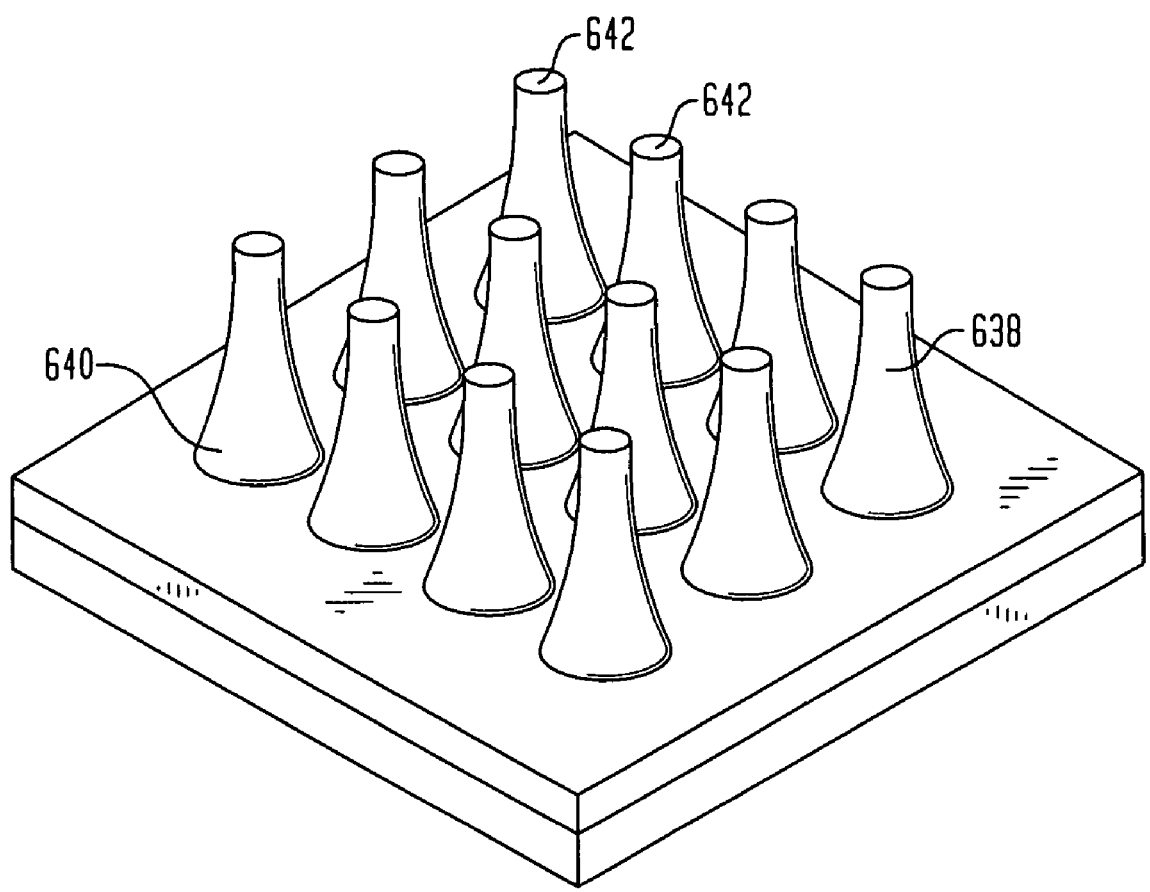
FIG. 13 shows a microelectronic assembly, in accordance with a further preferred embodiment of the present invention.

Referring to FIG. 13, in certain preferred embodiments of the present invention, the conductive posts 638 may be generally frusto-conical in shape, whereby the base 640 and the tip 642 of each post 638 are substantially circular. In these particular preferred embodiments, the bases 640 of the posts typically are about 100-600 micrometers in diameter, whereas the tips 642 typically are about 40-200 micrometers in diameter. The exterior surfaces of the conductive posts may be optionally plated with a highly conductive layer, such as gold, gold/nickel, gold/osmium or gold/palladium, or alternately plated with a wear resistant, conductive coating such as osmium to ensure that a good connection is made when the posts are either soldered or socketed to a substrate.

Figure 14:
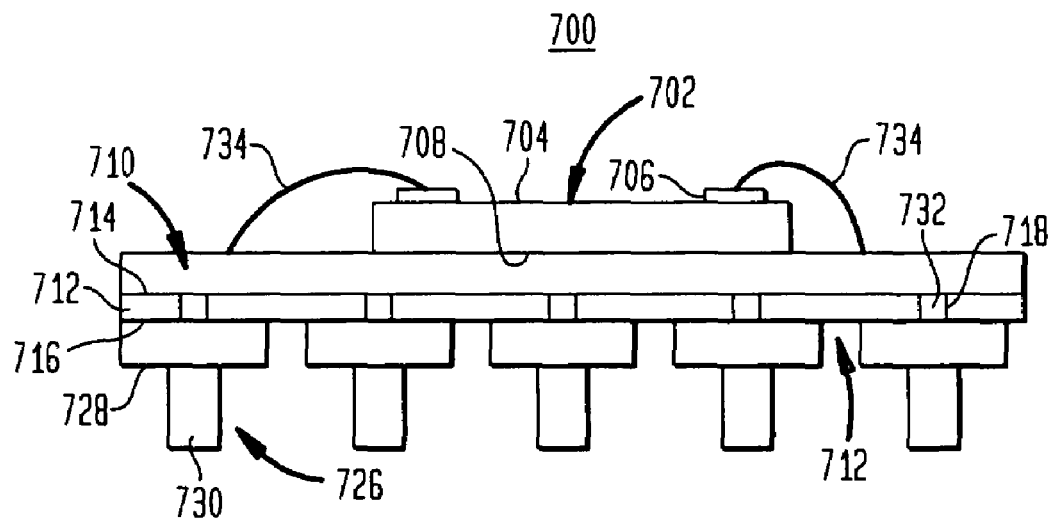
FIG. 14 shows a microelectronic assembly having conductive posts, in accordance with certain preferred embodiments of the present invention.

FIG. 14 shows a microelectronic package 700 including a microelectronic element 702 such as a semiconductor chip. The microelectronic element 702 preferably has a first surface 704 with contacts 706 accessible at the first surface and a rear surface 708. The microelectronic package 700 also desirably includes a compliant layer 710 disposed between the rear surface 708 of the microelectronic element 702 and a flexible sheet 712, which has a top surface 714 and a bottom surface 716 remote therefrom. In certain preferred embodiments, the flexible substrate 712 is made of a dielectric material such as a polyimide. The flexible substrate 712 may have a plurality of vias 718 extending between the top surface 714 and the bottom surface 716 thereof.

The microelectronic package 700 preferably includes dual-diameter conductive posts 726 or conductive pins that project from the flexible substrate 712. Each conductive post 726 preferably includes a base 728 that is in contact with the bottom surface 716 of the dielectric substrate 712 and a tip 730 that is connected to the base 728. In certain preferred embodiments, the tip 730 has a cylindrical shape. In still other preferred embodiments, the base 728 has a cylindrical shape and the tip 730 has a cylindrical shape. As will be described in more detail below, the base 728 of the conductive post preferably has a first diameter, and the tip 730 has a second diameter that is smaller than the first diameter. In certain preferred embodiments, the tip 730 of one or more of the conductive posts has a height that is greater than the height of the base portion 728 of the post.

The microelectronic package 700 also preferably includes conductive elements 732 that are provided in the vias 718 of the flexible substrate 712. The conductive elements 732 preferably electrically interconnect the bases 728 of the conductive posts with other conductive elements provided on the flexible substrate 712 such as conductive traces, conductive pads and conductive vias (not shown). The conductive elements 732 preferably have a third diameter that is smaller than the second diameter of the tips 730 as well as the first diameter of the bases 728. The microelectronic package 700 also preferably includes wire bonds 734 that electrically interconnect the microelectronic elements 702 with the conductive posts 726. The wire bonds 734 may be electrically interconnected with the conductive elements 732 or other conductive features such as conductive traces (not shown) provided on the flexible substrate 712. In still other preferred embodiments of the present invention, the contact bearing face of the microelectronic element 702 may face the flexible substrate 712.

In certain preferred embodiments, the dual-diameter conductive posts may be made of different metals. In one particular preferred embodiment, the base 728 of the conductive post 726 is made of a first metal and the tip 730 is made of a second metal. In preferred embodiments, the tip 730 may be concentric with the base 728. The diameter of the cylindrical tip 730 is preferably about 60-100 microns and more preferably about 80 microns in diameter. The base 728 preferably has a diameter that is larger than the diameter of the tip 730. The diameter of the base 728 is preferably sufficient to ensure a reliable mechanical joint between the base and the dielectric substrate 712. As is well known to those skilled in the art, when forces are exerted upon the conductive posts, the forces cause the conductive posts to pitch or roll, which may result in a peeling stress between the base of the conductive post and the substrate to which is attached. The present invention seeks to avoid this problem by providing a large diameter base 728 that helps to distribute the stress and increase the mechanical reliability of the interconnection.

Figure 15:
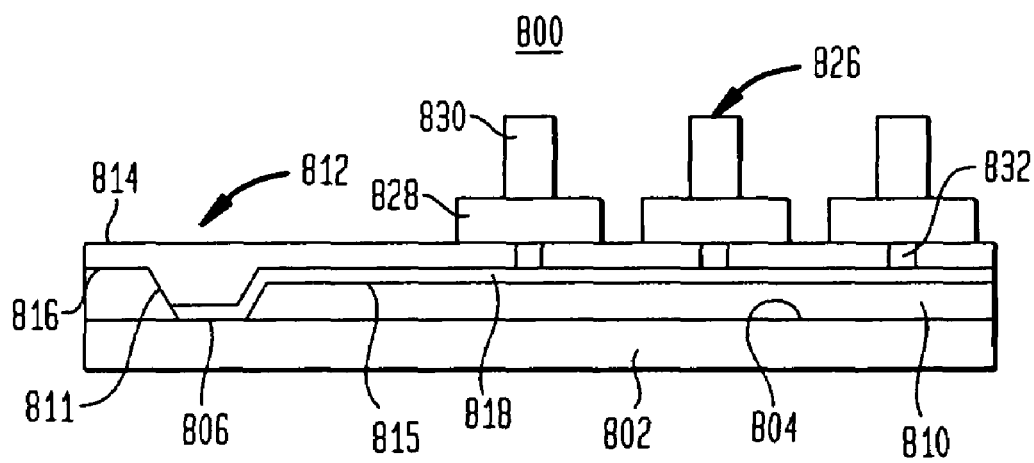
FIG. 15 shows a microelectronic assembly having conductive posts, in accordance with another preferred embodiment of the present invention.

FIG. 15 shows a microelectronic assembly 800, in accordance with another preferred embodiment of the present invention. The microelectronic assembly preferably includes a microelectronic element 802 such as a semiconductor chip or semiconductor wafer having a first surface 804 with contacts 806 accessible at the first surface. As noted above, the microelectronic element may be a semiconductor chip, a semiconductor wafer of any other microelectronic structure having internal circuitry. The microelectronic assembly 800 desirably includes a compliant layer 810 that overlies the first surface 804 of the microelectronic element 802. The compliant layer 810 preferably has openings 811 formed therein for providing access to the contacts 806. A conductive material such as conductive traces 815 is preferably provided atop the compliant layer 810. The conductive traces 815 preferably have first ends electrically interconnected with the contacts 806 and second ends that extend over a top surface of the compliant layer 810. A layer of a dielectric material 812 is preferably provided over the conductive traces 815 and the compliant layer 810. The dielectric layer 812 preferably has a top surface 814, a bottom surface 816 and vias 818 that extend from the top surface 814 to the bottom surface 816.

The microelectronic package 800 preferably includes dual-diameter conductive posts 826 having larger diameter bases 828 and smaller diameter tips 830 that extend from the bases 828. In certain preferred embodiments, the bases and/or the tips may be cylindrical in shape. The bases 828 preferably have bottom surfaces or undersides that are in contact with the top surface 814 of the dielectric layer 812. The tips 830 preferably project away from upper surfaces of the bases 828. The microelectronic assembly 800 also includes conductive elements 832 that electrically interconnect the bases 828 and the conductive traces 815. The tips 830 preferably have diameters that smaller than the diameters of the bases 828. In addition, the conductive elements 832 preferably have diameters that are smaller than the diameters of the tips 830 and the bases 828.

Figure 16:
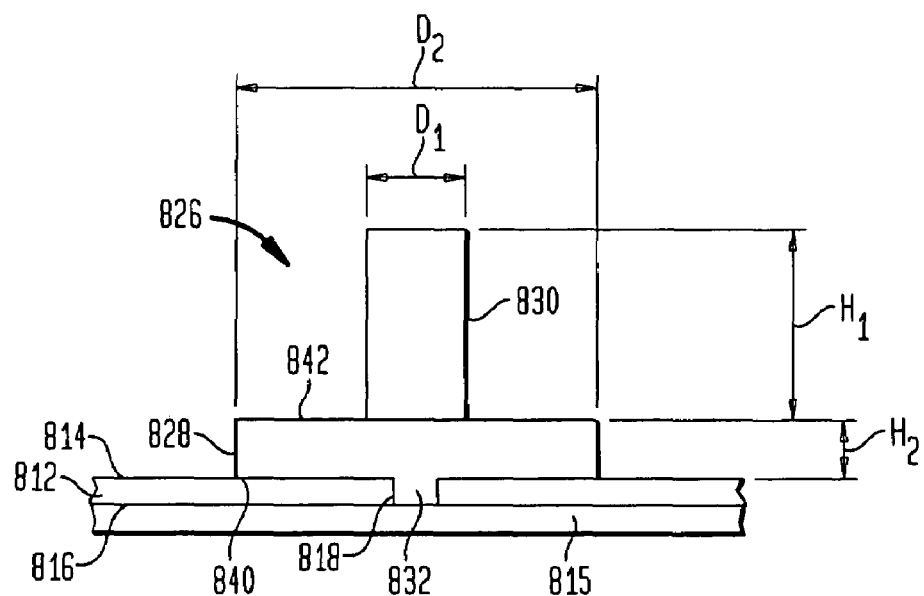
FIG. 16 shows a fragmentary view of a microelectronic assembly having dual-diameter conductive posts, in accordance with certain preferred embodiments of the present invention.

FIG. 16 shows a microelectronic assembly having a dual-diameter conductive post 826, in accordance with certain preferred embodiments of the present invention. The conductive post 826 includes a conductive base 828 having a bottom surface 840 in contact with a top surface 814 of a dielectric layer 812. The conductive base 828 also preferably includes a top surface 842 that is remote from the bottom surface 840. The dual-diameter conductive post 826 also includes a conductive tip 830 that is connected with the top surface 842 of the conductive base 828 and projects away from the dielectric layer 812.

As shown in FIG. 16, the dielectric layer 812 preferably has one or more vias 818 that extend between the top and bottom surfaces 814, 816 of the dielectric layer 812. The microelectronic package includes a conductive element 832 that extends from the bottom surfaces 840 of the cylindrical base 828 for electrically interconnecting the cylindrical base 828 with conductive features such as conductive traces 815.

The cylindrical tip 830 preferably has a first diameter $D_1$ that is smaller than a second diameter $D_2$ of the cylindrical base 828. In addition, as shown in FIG. 16, the conductive element 832 has a smaller diameter than the diameter $D_1$ of the cylindrical tip 830 and the diameter $D_2$ of the cylindrical base 828. In addition, the cylindrical tip 830 preferably has a height $H_1$ that is greater than the height $H_2$ of the cylindrical base 828. In certain preferred embodiments, $H_1$ is two or more times greater in height than $H_2$.

Although the present invention is not limited by any particular theory of operation, it is believed that the conductive element 832 projecting from the bottom surface 840 of the cylindrical base 828 increases the number of wiring traces or conductive traces that may be located in the area underneath the larger diameter cylindrical base. As most of the diameter of the cylindrical base 828 is in contact with the dielectric layer 812, additional wiring traces may be run under the cylindrical base for increasing the signal carrying capacity of the dielectric substrate 812.

Figure 17:
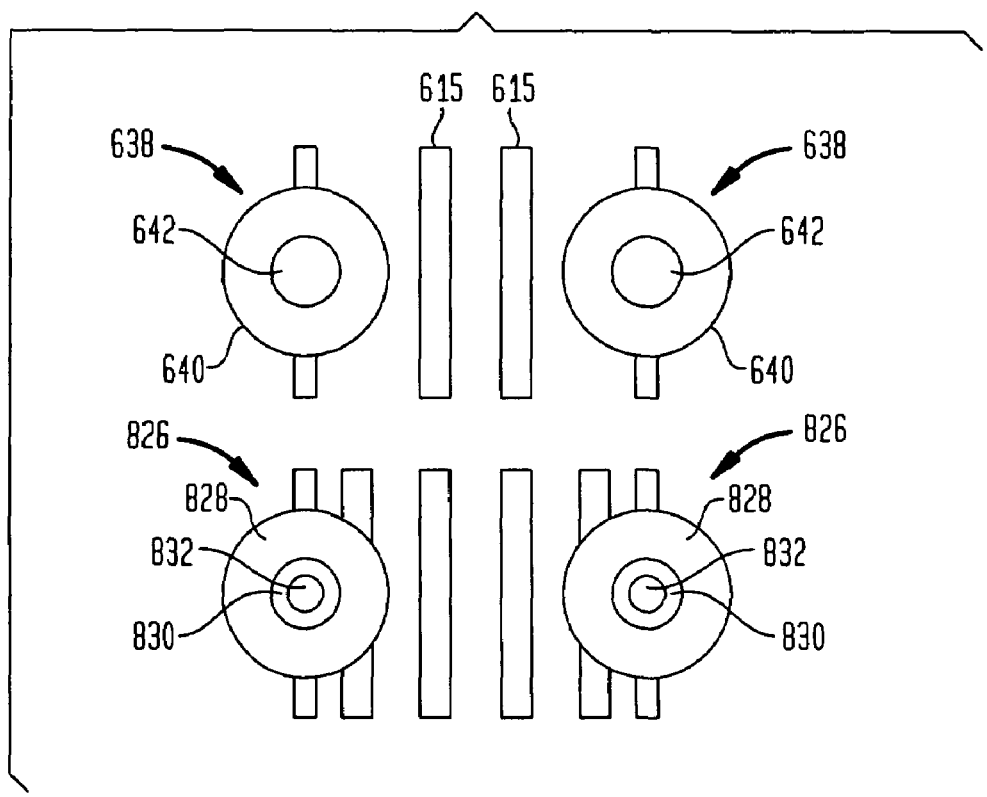
FIG. 17 shows a plan view of a first microelectronic assembly having conductive posts and a second microelectronic assembly having dual-diameter conductive posts.

The top section of FIG. 17 shows the conductive posts 638 shown in FIG. 13. Each conductive post 638 includes a larger diameter base 640 that tapers inwardly to a smaller diameter tip 642. As shown in FIG. 13, the conductive posts may have a cooling tower shape with an outer surface that tapers inwardly between the base 640 and the tip region 642. The underside of the base of the conductive post 638 shown in FIG. 17 does not have the conductive elements 832 extending from the bottom thereof, as shown in FIG. 16. As a result, the number of conductive traces 615 that may pass between the bases of the conductive posts 638 is minimized. In contrast, the lower section of FIG. 17 shows the microelectronic assembly shown in FIGS. 14-17. In this particular embodiment, each conductive post 826 has a larger diameter base 828 and a smaller diameter tip 830 that projects from an upper surface of the base 828. Each conductive post also preferably includes a conductive element 832 that projects from a bottom surface of the base 828. Only the conductive element 832 is in contact with the conductive trace 815 running underneath the conductive post 826. The remainder of the bottom surface 840 of the base 828 is in contact with the top surface 814 of dielectric layer 812. As a result, additional conductive traces 815 can run underneath a portion of the conductive base 828 while remaining electrically isolated from the conductive base 828. As a result, additional conductive traces 815 can run between the conductive posts 826. The additional conductive traces 815 increase the signal transmission capacity over the same area of the dielectric layer. The increased capacity is evident by comparing the top section of FIG. 17 with the bottom section of FIG. 17.

Figure 18A:
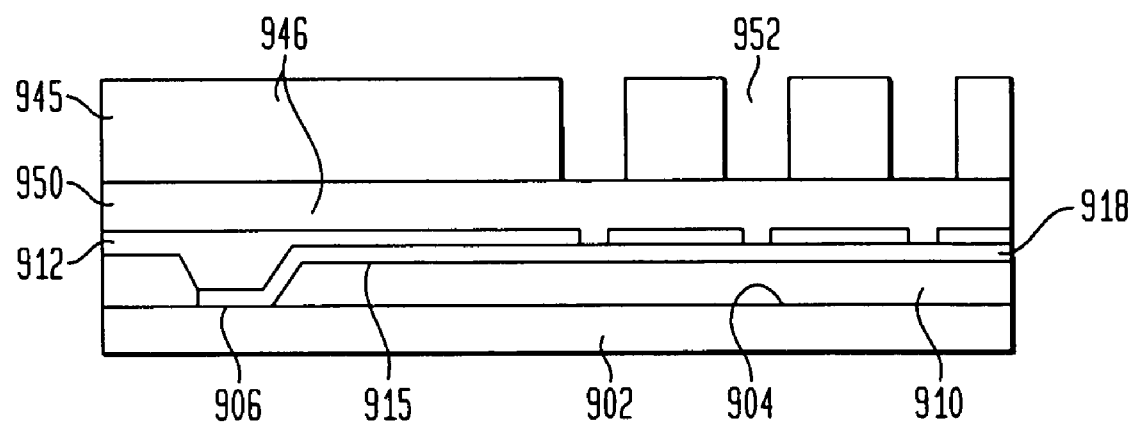
FIGS. 18A-18E shows a method of making a microelectronic assembly having dual-diameter conductive posts, in accordance with certain preferred embodiments of the present invention.

FIGS. 18A-18E show a method of making microelectronic assemblies having dual-diameter conductive posts, in accordance with further preferred embodiments of the present invention. Referring to FIG. 18A, the microelectronic assembly includes a microelectronic element 902 having a first surface 904 and contacts 906 accessible at the first surface 904. A compliant layer 910 is provided over the first surface 904 of the microelectronic element 902. The compliant layer has openings for providing access to the contacts 906. A conductive material such as a conductive trace 915 is then provided over the compliant layer 910. The conductive traces 915 preferably have first ends connected to the contacts 906 and second ends that overlie the top surface of the compliant layer 910. A layer of a dielectric material 912 may be provided over the conductive traces 915 and the compliant layer 910. The layer of dielectric material 912 preferably includes one or more vias 918 extending therethrough. Each of the vias preferably extends from a top surface to a bottom surface of the dielectric layer 912 for providing access to the conductive trace 915.

A bi-layer resist 946, also known as a lift-off resist, is desirably provided atop the dielectric layer 912. The bi-layer resist 946 includes a first resist layer 948 and a second resist layer 950. Each resist layer is preferably a discreet layer having a different solvent chemistry so that portions of one of the layers may be effectively removed while the other layer remains in place. In certain preferred embodiments, the thicknesses of the first and second resist layers may control the thickness/height of the bases and tips that are formed using the resist layers. In one particular preferred embodiment, the thickness of the second resist layer 950 approximates the height of the cylindrical base portion of the conductive posts and the thickness of the first resist layer 948 approximates the desired height of the cylindrical tip of the conductive posts.

Referring to FIG. 18A, a photomask, expose and develop process is used to define apertures 952 in the first resist layer 948. The apertures 952 preferably have diameters that are equal to the diameters of the cylindrical tips.

Figure 18B:
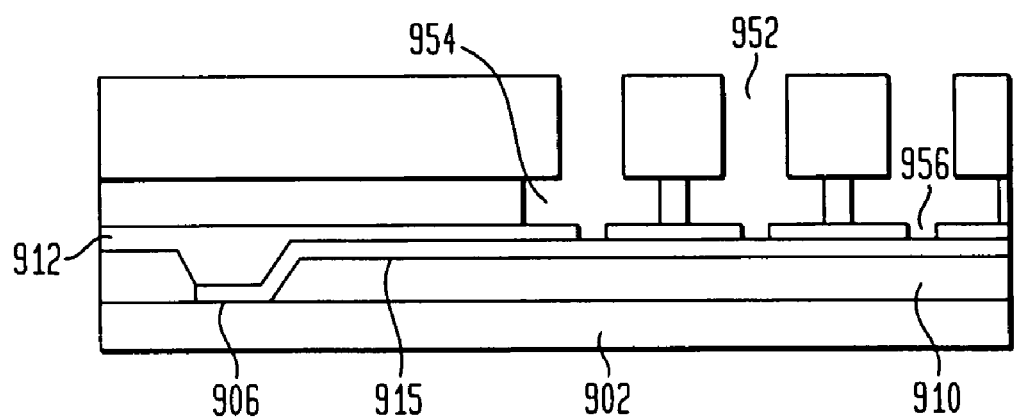

Referring to FIG. 18B, a selective dissolution process is preferably used to dissolve the second resist layer 950 to form second apertures 954 for the cylindrical bases and third apertures 956 extending through the dielectric layer 912 that are used to form the conductive elements that interconnect the bases with the conductive traces.

An electroless plating process may be used to form the dual-diameter conductive posts in the first aperture 952, the second aperture 954 and third aperture 956. In preferred embodiments, activators in an electroless plating procedure insure that the conductive base of the post is firmly bonded to the dielectric layer.

Figure 18C:
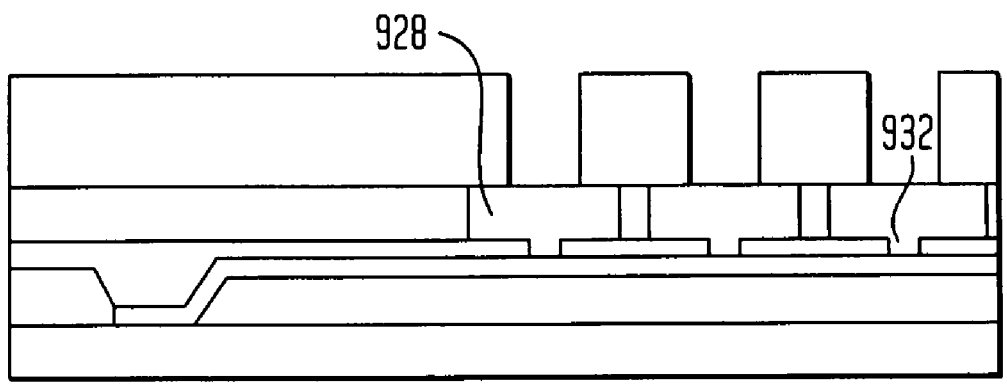
Figure 18D:
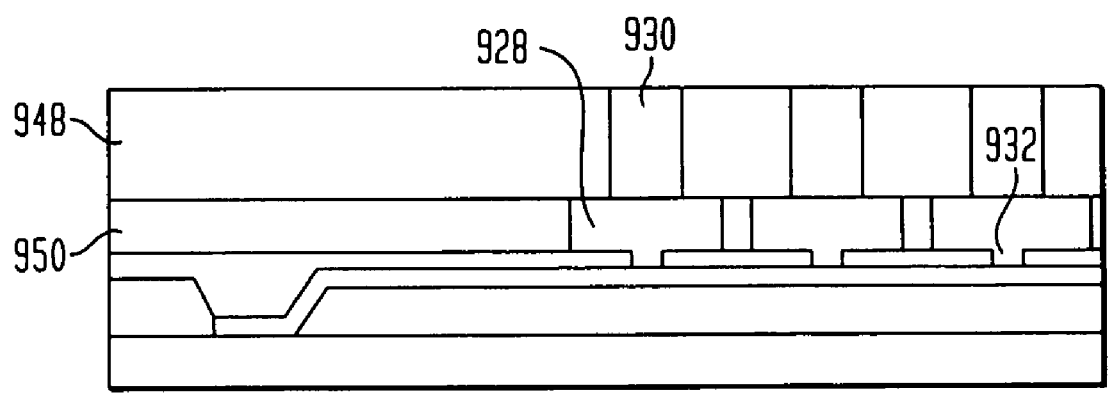

Referring to FIG. 18C, the second aperture 952 and the third aperture 956 may be filled with a conductive material for forming the cylindrical base 928 and the conductive element 932 that extends from the underside of the cylindrical base 928. Referring to 18D, a second conductive material may be disposed in the first aperture 952 for forming the cylindrical tip 930. The process of building up the cylindrical base and cylindrical tip may be accomplished using an electroless copper plating process. The first and second resist layers 948, 950 may then be removed to provide exposed dual-diameter conductive posts.

Figure 18E:
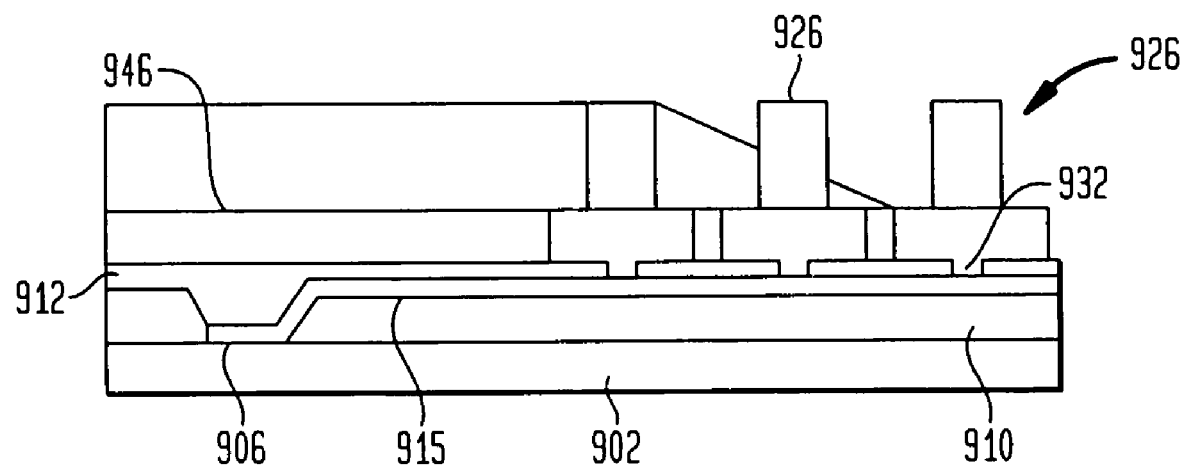

FIG. 18E shows the first and second layers of the resist being removed to expose the dual-diameter conductive posts 926, which are electrically interconnected with conductive traces 915 through the conductive elements 932 extending through dielectric layer 912.

Figure 19A:
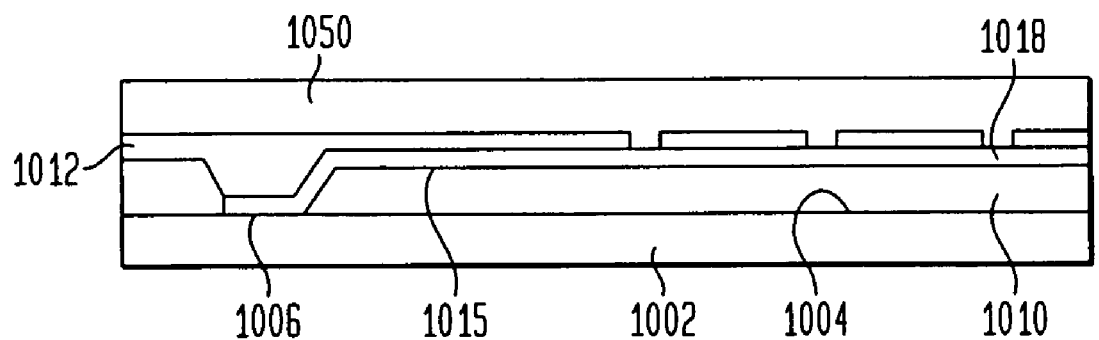
FIGS. 19A-19C shows a method of making a microelectronic assembly having dual-diameter conductive posts, in accordance with other preferred embodiments of the present invention.
Figure 19B:
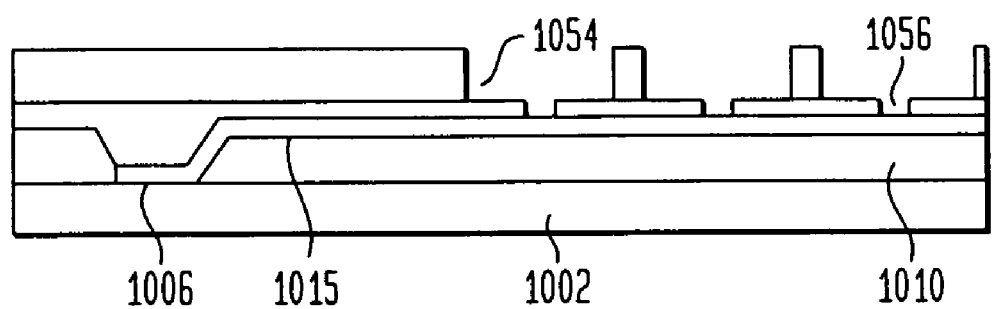
Figure 19C:
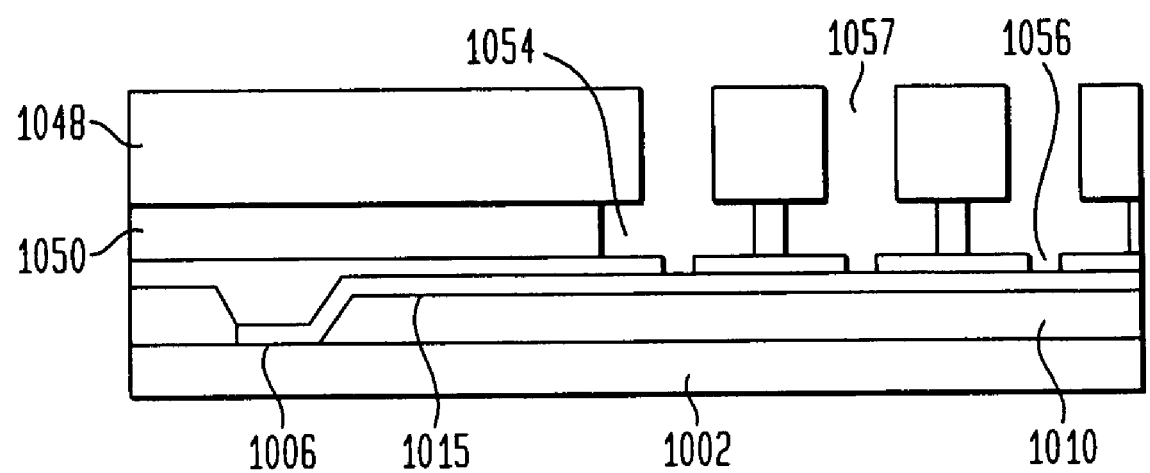

FIGS. 19A-19C show a method of making microelectronic assemblies having dual-diameter conductive posts, in accordance with other preferred embodiments of the present invention. Referring to FIG. 19A, the microelectronic assembly includes a microelectronic element 1002 having a first surface 1004 and contacts 1006 accessible at the first surface 1004. A compliant layer 1010 is provided over the first surface 1004 of the microelectronic element 1002. The compliant layer has openings for providing access to the contacts 1006. A conductive material such as a conductive trace 1015 is provided over the compliant layer 1010. The conductive traces 1015 preferably have first ends connected to the contacts 1006 and second ends that overlie the top surface of the compliant layer 1010. A layer of a dielectric material 1012 may be provided over the conductive traces 1015 and the compliant layer 1010. The layer of dielectric material 1012 preferably includes one or more vias 1018 extending therethrough. Each of the vias preferably extends from a top surface to a bottom surface of the dielectric layer 1012 for providing access to the conductive trace 1015.

A first resist layer 1050 is desirably provided atop the dielectric layer 102. The first resist layer 1050 is preferably a discreet layer having a solvent chemistry so that portions of the first layer may be effectively removed. In certain preferred embodiments, the thicknesses of the first resist layer 1050 may control the thickness/height of the bases that are formed using the first resist layer. In one particular preferred embodiment, the thickness of the first resist layer 1050 approximates the height of the cylindrical base portion of the conductive posts.

Referring to FIG. 19B, a photomask, expose and develop process or a selective dissolution process may be used to form first apertures 1054 for the cylindrical bases and second apertures 1056 extending through the dielectric layer 1012 that are used to form the conductive elements that interconnect the cylindrical bases with the conductive traces 1015.

Referring to FIG. 19C, after the openings 1054, 1056 have been formed in the first resist layer 1050, a second resist layer 1048 may be deposited atop the first resist layer. A photomask, expose and develop process may be used to define tip apertures 1057 in the second resist layer 1048. The tip apertures 1057 preferably have diameters that are equal to the diameters of the cylindrical tips.

An electroless plating process may be used to form the dual-diameter conductive posts in the tip aperture 1057, the first aperture 1054 and the second aperture 1056. In preferred embodiments, activators in an electroless plating procedure insure that the conductive base of the post is firmly bonded to the dielectric layer.

As described above with reference to FIG. 18C, the first and second apertures in the first resist layer may be filled with a conductive material for forming the cylindrical base and the conductive element that extends from the underside of the cylindrical base. As described above with reference to 18D, a second conductive material may be disposed in the tip aperture 1057 (FIG. 19C) for forming a cylindrical tip. The process of building up the cylindrical base and cylindrical tip may be accomplished using an electroless copper plating process. After the dual-diameter conductive posts have been formed, the first and second resist layers may be removed to provide exposed dual-diameter conductive posts.

Figure 20A:
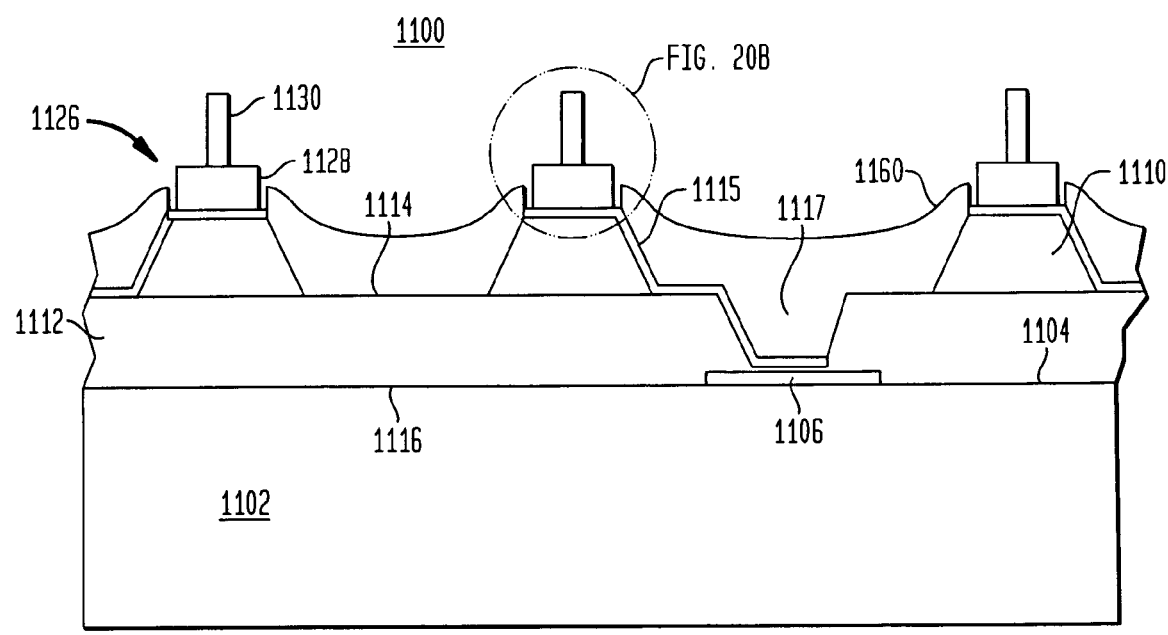
FIGS. 20A-20B show a microelectronic assembly, in accordance with yet another preferred embodiment of the present invention.

FIG. 20A shows a microelectronic assembly, in accordance with another preferred embodiment of the present invention. The microelectronic assembly 1100 includes a semiconductor wafer 1102 having a top surface 1104 and contacts 1106 being accessible at the top surface 1104. The microelectronic assembly includes a dielectric layer 1112 overlying the first surface 1104 of the wafer 1102. The dielectric layer 1112 has a top surface 1114 and a bottom surface 1116. The dielectric layer 1112 includes one or more openings 1117 extending from the top surface 1114 to the bottom surface 1116 for exposing the contacts 1106.

The assembly desirably includes compliant bumps 1110 that are provided atop the dielectric layer 1112, and conductive traces 1115 having first ends electrically interconnected with contacts 1106 and second ends overlying the compliant bumps 1110. The second ends of the conductive traces 1115 form conductive terminals atop the compliant bumps 1110. Dual-diameter conductive posts 1126 are formed atop the conductive terminals. The dual-diameter conductive posts are preferably of similar structure as described above, and may be formed using the methods described above. Each conductive post preferably includes a cylindrical base 1128 and a cylindrical tip 1130 that extends from the base. The cylindrical bases 1128 preferably has diameters that are larger than the diameters of the cylindrical tips 1130.

Figure 20B:
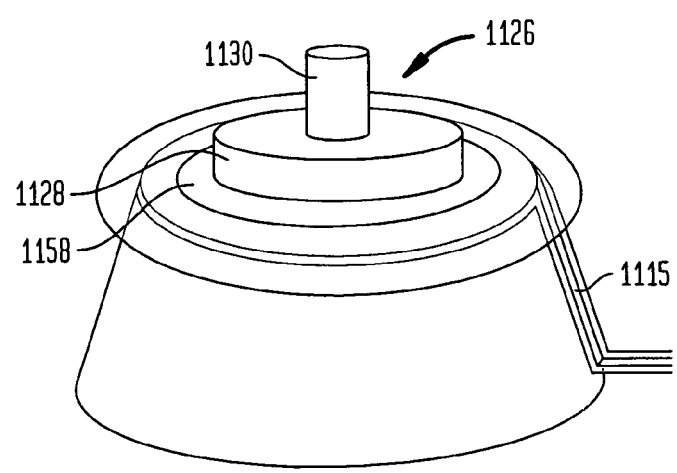

A layer of a dielectric material 1160 may be provided over the dielectric layer 1112 and the conductive traces 1115. FIG. 20B shows an enlarged view of one of the dual-diameter conductive posts 1126. The dual-diameter conductive post 1126 includes a cylindrical base 1128 formed atop conductive terminal 1158, which in turn is electrically interconnected with conductive trace 1115 that extends from the compliant bump to the contacts on the wafer. The conductive posts also preferably includes a cylindrical tip 1130 that projects from a top surface of the cylindrical base 1128. In certain preferred embodiments, the wafer 1102 may be diced for providing microelectronic packages comprising one or more microelectronic elements such as semiconductor chips.

In certain preferred embodiments of the present invention, different materials are used for making different parts of the conductive posts. In one preferred embodiment, the large diameter conductive bases may be made of a higher modulus material, such as nickel, and the smaller diameter conductive tips may be made of a lower modulus metal such as gold. Such a structure may be beneficial when necessary to provide conductive posts having a degree of plastic compliance. The nickel base preferably distributes applied compressive stress when the gold tip is plastically deformed. In still other preferred embodiments of the present invention, a portion of the conductive post may be made using a conductive polymer.

In certain preferred embodiments, the apexes of the post tips may be planarized by polishing. The polishing step for planarizing may occur after filling the apertures in the bi-layer resist but before removal of the bi-layer resist.

In certain preferred embodiments of the present invention, the posts may have a shape that facilitates a tilting motion that causes the tip of each post to wipe across an opposing contact pad as the tip is engaged with the contact pad. This tilting motion promotes reliable electrical contact. As discussed in greater detail in the co-pending, commonly assigned U.S. patent application Ser. No. 10/985,126, filed Nov. 10, 2004, entitled "MICRO PIN GRID ARRAY WITH WIPING ACTION," the disclosure of which is incorporated by reference herein, the posts may be provided with features which promote such wiping action and otherwise facilitate engagement of the posts and contacts. Conductive posts having other shapes and designs that promote wiping and/or good electrical contact are disclosed in greater detail in co-pending, commonly assigned U.S. patent application Ser. No. 10/985,119, filed Nov. 10, 2004, entitled "MICRO PIN GRID WITH PIN MOTION ISOLATION," and commonly assigned U.S. patent application Ser. No. 11/014,439, filed Dec. 16, 2004, entitled "MICROELECTRONIC PACKAGES AND METHODS THEREFOR," the disclosures of which is hereby incorporated by reference herein.

In certain preferred embodiments of the present invention, a particle coating such as that disclosed in U.S. Pat. Nos. 4,804,132 and 5,083,697, the disclosures of which are incorporated by reference herein, may be provided on one or more electrically conductive parts of a microelectronic package for enhancing the formation of electrical interconnections between microelectronic elements and for facilitating testing of microelectronic packages. The particle coating is preferably provided over conductive parts such as conductive terminals or the tip ends of conductive posts. In one particularly preferred embodiment, the particle coating is a metalized diamond crystal coating that is selectively electroplated onto the conductive parts of a microelectronic element using standard photoresist techniques. In operation, a conductive part with the diamond crystal coating may be pressed onto an opposing contact pad for piercing the oxidation layer present at the outer surface of the contact pad. The diamond crystal coating facilitates the formation of reliable electrical interconnections through penetration of oxide layers, in addition to traditional wiping action.

The posts may also be fabricated by a process such as that disclosed in co-pending, commonly assigned U.S. patent application Ser. No. 10/959,465, filed Oct. 6, 2004 and entitled "Formation of Circuitry With Modification of Feature Height," the disclosure of which is hereby incorporated by reference herein.

Although the present invention is not limited by any particular theory of operation, it is believed that providing conductive posts atop a compliant material as disclosed herein will provide a compliant wafer-level or chip package that accommodates thermal mismatch and insures the formation of proper electrical interconnections. In addition, the use of conductive pins or posts enables the microelectronic assemblies and/or wafers to be tested by abutting the tips of the conductive posts directly against the contacts on a test board, without requiring the use of a test socket.

Although the present disclosure provides a particular sequence for making the microelectronic assemblies and wafers described herein, the order of the sequence may be altered and still fall within the scope of the present invention.

In certain preferred embodiments, the structures disclosed herein may be used to make a test board having a compliant layer and conductive posts projecting from the compliant layer. The contacts on a bare wafer or die may be abutted against the tips of the conductive posts for testing the wafer or die.

As described above in earlier embodiments, the conductive posts are free to move independently of other conductive posts so as to ensure reliable contact between each conductive post and each conductive pad on a test board. The tips of the conductive posts are able to move so as to compensate for potential differences in vertical spacing so that all of the tips can be brought into contact with all of the conductive pads simultaneously using with only a moderate vertical force applied to urge a testable package and a test board together. In this process, at least some of the tips of the conductive posts are displaced in the vertical or z direction relative to others of the post tips. Further, different portions of the flexible substrate associated with different conductive posts can deform independently of one another. In practice, the deformation of the substrate may include bending and/or stretching of the substrate so that the motion of the base may include a tilting about an axis in the x-y or horizontal plane as well as some horizontal displacement of the base, and may also include other components of motion.

The dimensions of the conductive posts can vary over a significant range, but most typically the height of each post above the surface of the dielectric substrate is about 50-300 µm. Each post has a base adjacent the dielectric substrate and a tip remote from the dielectric substrate. In certain preferred embodiments, the posts are generally frustoconical, so that the base and tip of each post are substantially circular. The bases of the posts typically are about 100-600 µm in diameter, whereas the tips typically are about 40-200 µm in diameter. The posts may be formed from any electrically conductive material, but desirably are formed from metallic materials such as copper, copper alloys, gold and combinations thereof. For example, the posts may be formed principally from copper with a layer of gold at the surfaces of the posts.

In certain preferred embodiments, the conductive traces are disposed on a bottom surface of the dielectric layer. However, in other embodiments, the conductive traces may extend on the top surface of the dielectric layer; on both the top and bottom faces or within the interior of the dielectric layer. Thus, as used in this disclosure, a statement that a first feature is disposed "on" a second feature should not be understood as requiring that the first feature lie on a surface of the second feature. The conductive traces may be formed from any electrically conductive material, but most typically are formed from copper, copper alloys, gold or combinations of these materials. The thickness of the traces will also vary with the application, but typically is about 5 µm-25 µm.

The tips of the posts may not be precisely coplanar with one another, due to factors such as non-planarity of the front surface of the microelectronic device; warpage of the dielectric substrate; and unequal heights of the posts themselves. Also, the package may be tilted slightly with respect to the circuit board. For these and other reasons, the vertical distances between the tips of the posts and the contact pads may be unequal. The independent displacement of the posts relative to one another allows all of the post tips to contact all of the contact pads on the test substrate.

Because all of the post tips can be engaged reliably with all of the contact pads, the package can be tested reliably by applying test signals, power and ground potentials through the test circuit board and through the engaged posts and contact pads. Moreover, this reliable engagement is achieved with a simple test circuit board. For example, the contact pads of the test circuit board are simple, planar pads. The test circuit board need not incorporate special features to compensate for non-planarity or complex socket configurations. The test circuit board can be made using the techniques commonly employed to form ordinary circuit boards. This materially reduces the cost of the test circuit board, and also facilitates construction of the test circuit board with traces (not shown) in a simple layout compatible with high-frequency signals. Also, the test circuit board may incorporate electronic elements such as capacitors in close proximity to the contact pads as required for certain high-frequency signal processing circuits. Here again, because the test circuit board need not incorporate special features to accommodate non-planarity, placement of such electronic elements is simplified. In some cases, it is desirable to make the test circuit board as planar as practicable so as to reduce the non-planarity of the system and thus minimize the need for pin movement. For example, where the test circuit board is highly planar a ceramic circuit board such as a polished alumina ceramic structure, only about 20 µm of pin movement will suffice.

In certain preferred embodiments of the present invention, a particle coating such as that disclosed in U.S. Pat. Nos. 4,804,132 and 5,083,697, the disclosures of which are incorporated by reference herein, may be provided on one or more electrically conductive parts of a microelectronic package for enhancing the formation of electrical interconnections between microelectronic elements and for facilitating testing of microelectronic packages. The particle coating is preferably provided over conductive parts such as conductive terminals or the tip ends of conductive posts. In one particularly preferred embodiment, the particle coating is a metalized diamond crystal coating that is selectively electroplated onto the conductive parts of a microelectronic element using standard photoresist techniques. In operation, a conductive part with the diamond crystal coating may be pressed onto an opposing contact pad for piercing the oxidation layer present at the outer surface of the contact pad. The diamond crystal coating facilitates the formation of reliable electrical interconnections through penetration of oxide layers, in addition to traditional wiping action.

As discussed above, the motion of the posts may include a tilting motion. This tilting motion causes the tip of each post to wipe across the contact pad as the tip is engaged with the contact pad. This promotes reliable electrical contact. As discussed in greater detail in the co-pending, commonly assigned application Ser. No. 10/985,126 filed Nov. 10, 2004, entitled "MICRO PIN GRID ARRAY WITH WIPING ACTION" [TESSERA 3.0-375], the disclosure of which is incorporated by reference herein, the posts may be provided with features which promote such wiping action and otherwise facilitate engagement of the posts and contacts. As disclosed in greater detail in the co-pending, commonly assigned application Ser. No. 10/985,119 filed Nov. 10, 2004, entitled "MICRO PIN GRID WITH PIN MOTION ISOLATION", the disclosure of which is also incorporated by reference herein, the flexible substrate may be provided with features to enhance the ability of the posts to move independently of one another and which enhance the tilting and wiping action.

In certain preferred embodiments of the present invention, a microelectronic package, assembly or stack may include one or more features of one or more of the embodiments disclosed in U.S. Pat. No. 6,177,636, U.S. Pat. No. 6,826,827, U.S. Pat. No. 6,774,317, U.S. Pat. No. 6,465,878, U.S. application Ser. No. 10/959,465, filed Oct. 6, 2004, entitled "Formation of Circuitry With Modification of Feature Height"; U.S. application Ser. No. 11/166,861, filed Jun. 24, 2005, entitled "Structure With Spherical Contact Pins"; U.S. application Ser. No. 11/014,439, filed Dec. 16, 2004, claiming priority of U.S. Provisional Application Ser. No. 60/533,210, filed Dec. 30, 2003; U.S. application Ser. No. 10/985,126, filed Nov. 10, 2004, claiming priority of U.S. Provisional Application Ser. No. 60/533,393, filed Dec. 30, 2003; U.S. application Ser. No. 10/985,119, filed Nov. 10, 2004, claiming priority of U.S. Provisional Application Ser. No. 60/533,437, filed Dec. 30, 2003; U.S. patent application Ser. No. 10/993,962, filed Nov. 19, 2004; U.S. patent application Ser. No. 11/021,627, filed Dec. 23, 2005; U.S. patent application Ser. No. 11/140,312, filed May 27, 2005, claiming priority of U.S. Provisional Application Ser. No. 60/583,066, filed Jun. 25, 2004 and U.S. Provisional Application Ser. No. 60/621,865, filed Oct. 25, 2004; U.S. Provisional Application Ser. No. 60/662,199, filed Mar. 16, 2005; U.S. Patent Application Publication No. 2005/0035440; U.S. patent application Ser. No. 11/360,230, filed Feb. 23, 2006; U.S. patent application Ser. No. 11/318,164, filed Dec. 23, 2005; and U.S. Provisional Application Ser. No. 60/753,605, filed Dec. 23, 2005, entitled "MICROELECTRONIC PACKAGES AND METHODS THEREFOR", the disclosures of which are hereby incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package comprising:
a microelectronic element having contacts;
a flexible substrate spaced from and overlying said microelectronic element;
a plurality of substantially rigid conductive posts extending from said flexible substrate and projecting away from said microelectronic element, said conductive posts being electrically interconnected with said microelectronic element, each said conductive post having a cylindrical base that is in contact with said flexible substrate and a cylindrical tip that extends from said cylindrical base, wherein said base of said conductive post has a larger diameter than said tip of said conductive post.

2. The package as claimed in claim 1, wherein said bases of said conductive posts comprise a first conductive material and said tips of said conductive posts comprise a second conductive material that is different than said first conductive material.

3. The package as claimed in claim 2, wherein said bases comprise a first metal and said tips comprise a second metal.

4. The package as claimed in claim 2, wherein said bases comprise a material having a higher modulus and said tips comprise a material having a lower modulus than said bases.

5. The package as claimed in claim 1, wherein at least one of said conductive posts comprises a conductive polymer.

6. The package as claimed in claim 1, wherein said tips of said conductive posts have apexes that are co-planar.

7. The package as claimed in claim 1, wherein said tips of said conductive posts have a diameter of about 60-100 microns.

8. The package as claimed in claim 7, wherein said tips of said conductive posts have a diameter of about 80 microns.

9. The package as claimed in claim 1, further comprising a compliant layer between said microelectronic element and said flexible substrate.

10. The package as claimed in claim 1, wherein said flexible substrate comprises a dielectric material.

11. The package as claimed in claim 1, further comprising conductive traces provided on said flexible substrate.

12. The package as claimed in claim 11, wherein said conductive traces electrically interconnect at least some of said conductive posts and said microelectronic element.

13. The package as claimed in claim 11, wherein said flexible substrate has a first surface facing said microelectronic element and a second surface facing away from said microelectronic element, said conductive traces overlying the first surface of said flexible substrate.

14. The package as claimed in claim 13, wherein said flexible substrate has openings extending between said conductive traces and said bases of said conductive posts, said package further comprising conductive elements provided in the openings in said flexible substrate for electrically interconnecting said bases of said conductive posts and said conductive traces.

15. The package as claimed in claim 14, wherein said conductive elements have diameters that are smaller than the diameters of said tips of said conductive posts.

16. The package as claimed in claim 1, wherein said microelectronic element is selected from the group consisting of a semiconductor chip and a semiconductor wafer.

17. The package as claimed in claim 1, further comprising leads for electrically interconnecting said microelectronic element and said conductive posts.

18. The package as claimed in claim 1, wherein the substantially rigid conductive posts are comprised of copper.

19. A microelectronic package comprising:
a microelectronic element having contacts;
a flexible substrate spaced from said microelectronic element, said flexible substrate having a first surface facing said microelectronic element and a second surface facing away from said microelectronic element, said flexible substrate having vias extending from the first surface to the second surface thereof;
conductive traces overlying the first surface of said flexible substrate;

a compliant layer disposed between said microelectronic element and the first surface of said flexible substrate;

a plurality of substantially rigid conductive posts extending from the second surface of said flexible substrate and projecting away from said microelectronic element, said conductive posts being electrically interconnected with said microelectronic element, each said conductive post having a conductive base that is in contact with the first surface of said flexible substrate and a conductive tip that extends from said conductive base, wherein said base of said conductive post has a larger diameter than said tip of said conductive post; and conductive elements provided in the vias of said flexible substrate for electrically interconnecting said bases of said conductive posts with said conductive traces.

20. The package as claimed in claim 19, wherein said conductive tips of said conductive posts have a cylindrical shape.

21. The package as claimed in claim 19, wherein said conductive bases of said conductive posts have a cylindrical shape.

22. The package as claimed in claim 19, wherein said contacts on said microelectronic element face toward said flexible substrate.

23. The package as claimed in claim 19, wherein said bases of said conductive posts comprise a first metal and said tips of said conductive posts comprise a second metal that is different than said first metal.

24. The package as claimed in claim 19, wherein said conductive elements have diameters that are smaller than the diameters of said tips of said conductive posts.

25. The package as claimed in claim 19, wherein the substantially rigid conductive posts have a melting point greater than the melting point of solder.

26. A microelectronic assembly comprising:
a microelectronic element having a first surface and contacts accessible at the first surface;
a compliant layer overlying the first surface of said microelectronic element;
substantially rigid conductive posts overlying said compliant layer and projecting away from the first surface of said microelectronic element, each said conductive post having a cylindrical base that is in contact with the first surface of said flexible substrate and a cylindrical tip that extends from said cylindrical base, wherein said base of said conductive post has a larger diameter than said tip of said conductive post, and wherein said conductive posts are electrically interconnected with said contacts of said microelectronic element.

27. The assembly as claimed in claim 26, wherein said microelectronic element is a semiconductor wafer.

28. The assembly as claimed in claim 26, wherein said microelectronic element is a semiconductor chip.

29. The assembly as claimed in claim 26, wherein said compliant layer comprises a material selected from the group consisting of silicones, flexibilized epoxies, polyimides, thermosetting polymers, fluoropolymers and thermoplastic polymers.

30. The assembly as claimed in claim 26, wherein the top surface of said compliant layer is substantially flat.

31. The assembly as claimed in claim 26, further comprising electrically conductive traces for electrically interconnecting said conductive posts and said contacts of said microelectronic element.

32. The assembly as claimed in claim 26, wherein said conductive traces comprises materials selected from the group consisting of copper, gold, nickel and alloys, combinations and composites thereof.

33. The assembly as claimed in claim 32, wherein said elongated, electrically conductive elements extend over said compliant layer.

34. The assembly as claimed in claim 26, wherein each said conductive post has a height of about 50-300 microns.

35. The assembly as claimed in claim 26, wherein the tips of said conductive posts have a height that is greater than a height of the bases of said conductive posts.

36. A microelectronic assembly comprising:
a microelectronic element having a first surface and contacts accessible at the first surface;
a compliant layer overlying the first surface of said microelectronic element, said compliant layer having a top surface spaced from the first surface of said microelectronic element;
substantially rigid conductive posts overlying the top surface of said compliant layer and projecting away from the first surface of said microelectronic element, each said conductive post having a conductive base that is in contact with the first surface of said flexible substrate and a conductive tip that extends from said conductive base, wherein said base of said conductive post has a larger diameter than said tip of said conductive post; and
conductive traces electrically interconnecting said conductive posts and said contacts of said microelectronic element.

37. The assembly as claimed in claim 36, wherein said conductive tips have a cylindrical shape and said conductive bases have a cylindrical shape.

38. The assembly as claimed in claim 36, wherein said microelectronic element is a semiconductor wafer or a semiconductor chip.

* * * * *